United States Patent
Yoshida et al.

(10) Patent No.: US 6,798,798 B2
(45) Date of Patent: Sep. 28, 2004

(54) SEMICONDUCTOR LASER APPARATUS AND FABRICATION METHOD OF SAME, AND SEMICONDUCTOR LASER MODULE

(75) Inventors: Junji Yoshida, Tokyo (JP); Naoki Tsukiji, Tokyo (JP); Toshio Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 69 days.

(21) Appl. No.: 09/758,963

(22) Filed: Jan. 10, 2001

(65) Prior Publication Data

US 2002/0110161 A1 Aug. 15, 2002

(30) Foreign Application Priority Data

Dec. 12, 2000 (JP) ........................................ 2000-378103

(51) Int. Cl.[7] ................................................ H01S 3/13
(52) U.S. Cl. ...................... 372/29.021; 372/43; 372/44; 372/45; 438/31
(58) Field of Search ............................. 372/45, 46, 44, 372/29.021, 49, 64; 438/31; 385/88

(56) References Cited

U.S. PATENT DOCUMENTS

| | | | | |
|---|---|---|---|---|
| 4,720,834 A | * | 1/1988 | Yamamoto et al. | ............ 372/45 |
| 5,036,521 A | * | 7/1991 | Hatakoshi et al. | ............ 372/46 |
| 5,189,679 A | * | 2/1993 | Derry et al. | .................... 372/45 |
| 5,993,073 A | * | 11/1999 | Hamakawa et al. | ........... 385/88 |
| 6,174,748 B1 | * | 1/2001 | Jeon et al. | ..................... 438/31 |
| 6,233,264 B1 | * | 5/2001 | Sato | ............................. 372/45 |
| 6,249,534 B1 | * | 6/2001 | Itoh et al. | ...................... 372/49 |
| 6,343,088 B1 | * | 1/2002 | Mugino et al. | ................ 372/49 |
| 6,456,638 B1 | * | 9/2002 | Fukunaga | ..................... 372/45 |
| 2002/0064203 A1 | * | 5/2002 | Pezeshki et al. | ............... 372/64 |

OTHER PUBLICATIONS

Kimura, Toshio, et al., "250 mW 1480 nm Laser Diode Module for Optical Amplifier," *Furukawa Electric Review*, No. 105, Jan. 10, 2000, pp. 19–23. (Partial Translation attached).

Kimura, Toshio, et al., "1480 nm Laser Diode Module with 250–nW Output for Optical Amplifiers (FOL 1404QQ Series)," *Furukawa Review*, No. 19, Apr., 2000, pp. 29–33.

* cited by examiner

*Primary Examiner*—Don Wong
*Assistant Examiner*—Dung T Nguyen
(74) *Attorney, Agent, or Firm*—Sheppard Mullin Richter & Hampton LLP

(57) ABSTRACT

A cavity length is determined on the basis of a relationship of electric drive power to a range of optical output power over 50 mW, for cavity length to be constant as a parameter in a range over 1000 μm, so that the electric drive power is vicinal to a minimum thereof in correspondence to a desirable optical output power. If the optical output is 360 mW for example, a cavity length of 1500 μm is determined to be selected.

47 Claims, 15 Drawing Sheets

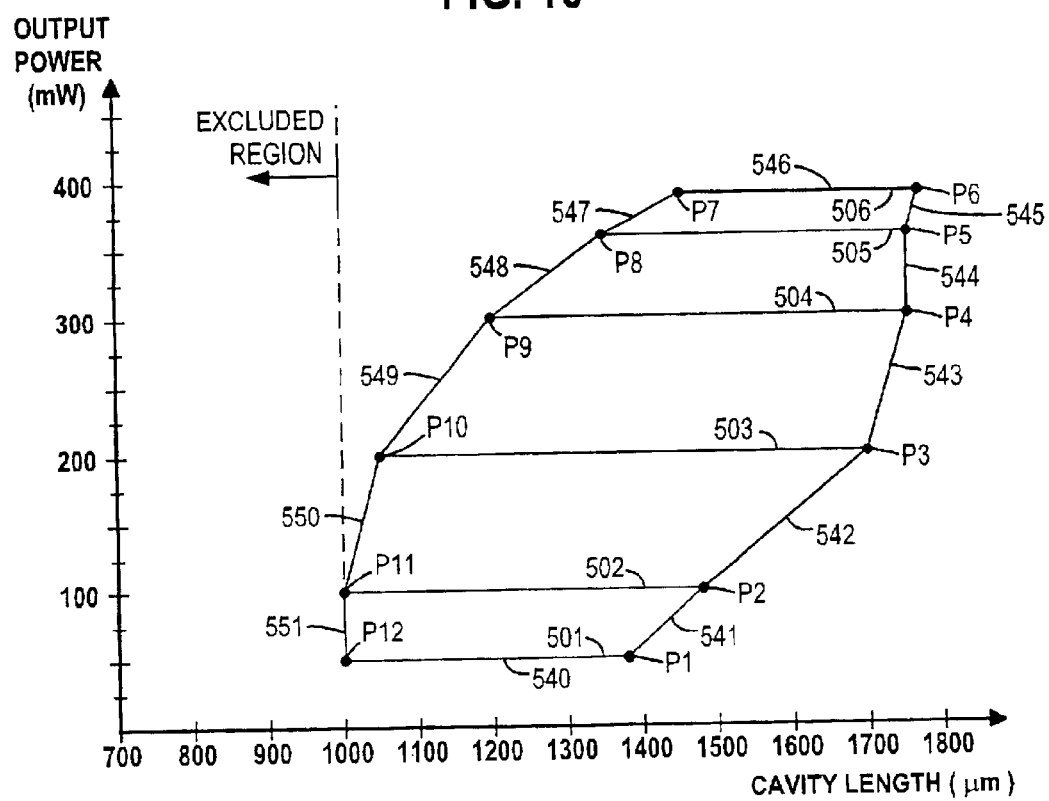

SEMICONDUCTOR LASER APPARATUS AND FABRICATION METHOD OF SAME, AND SEMICONDUCTOR LASER MODULE

FIELD OF THE INVENTION

The present invention relates to a semiconductor laser apparatus, and a semiconductor laser module, having a structure in which structures for implementing a desirable optical output power and a high energy conversion efficiency from input electric power to output optical power are adequately combined.

BACKGROUND OF THE INVENTION

Recently, with widespread use of various communication media such as the Internet, there have been increased demands for optical communication to be greater in capacity. In the optical communication in the past, at respective bands of wavelengths 1310 nm and 1550 nm where the absorption of light by an optical fiber is small, the transmission generally was performed by a single wavelength. In this system, for a greater quantity of information to be transmitted, it was necessary to install a greater number of cores of optical fibers in the transmission path, with increase in cost following increase in transmission capacity, as a problem.

For this reason, there has been applied a WDM (wavelength division multiplexing) communication system. The WDM communication system mainly employs an EDFA (Erbium Doped Fiber Amplifier), which is for a system that has a 1530–1570 nm band as an operation band, where it uses a plurality of wavelengths to perform transmission. This DWDM communication system or WDM communication system uses a single optical fiber for concurrent transmission of a plurality of optical signals different in wavelength, allowing for the network to have a greatly increased transmission capacity, without needing the installation of additional optical fiber lines (i.e., "new lines").

For excitation of the EDFA, there have been employed high-output pumping semiconductor laser modules. Among them, the 1480 nm-band pumping semiconductor laser module has advantages, such as 1) high reliability, 2) high conversion efficiency of erbium doped fiber, with merit in adaptation for the amplifier to be high of output, 3) wide absorption band of erbium doped fiber, enabling synthesis at multiple wavelengths, and 4) availability of peripheral optics such as isolators, wavelength synthesizers, and polarization synthesizers. As a result, by the use of wavelength synthesis, polarization synthesis, and the like, and by use of a plurality of pumping semiconductor laser modules, there has been implemented an pumping light source for high-output optical fiber amplifiers, and adapted for use in an optical fiber amplification system.

In general, in the semiconductor laser device (as a semiconductor laser apparatus), when injected electric current is increased, the optical output power increases. However, due to heat dissipation of the semiconductor laser device itself, a saturation in output power appears at a certain driving current, and thereafter the optical output power will not increase even with an increased driving current.

For the saturating driving current to be increased in value, the semiconductor laser apparatus had a cavity length elongated so that a desirable optical output power was obtained. On the contrary, to reduce the driving current required to obtain a desirable optical output power, there was selected an adequate cavity length, so that a semiconductor laser apparatus was configured with the selected cavity length. FIG. 14 is a graph showing a driving current vs. optical output power relationship for the cavity length of semiconductor laser apparatus taken as a parameter. For example, in case of a semiconductor laser apparatus to be adapted for an optical output power of 360 mW, a cavity length of 1200 $\mu$m was adopted so that the driving current was minimized in FIG. 14.

However, elongation of the cavity length in semiconductor laser apparatus accompanied variation in physical configuration of the semiconductor laser apparatus, with a result that, in case of determination of the cavity length of semiconductor laser apparatus simply depending on driving current, the electric drive power involved increases, not simply in electric power consumed for optical output power of the semiconductor laser apparatus, but also of reactive power consumed at other parts in the semiconductor laser apparatus itself, such as due to serial resistance and thermal resistance, sometimes causing, as a problem, a reduction of the photoelectric power conversion efficiency. (The photoelectric power conversion efficiency is often defined as an optical output power of a semiconductor laser apparatus divided by electric drive power of the semiconductor laser apparatus.)

Moreover, with increase in reactive power consumed by semiconductor laser apparatus, that is, in the difference between electric drive power and optical output power, which is mainly converted to heat, there was the need for a heat dissipating structure to be large, resulting in a large-sized semiconductor laser module for incorporation of the semiconductor laser apparatus, as a problem. The prior art has not investigated or considered selecting the value of the cavity length to minimize the electric drive power or to maximize the photoelectric conversion efficiency for a given optical output power. In addition, the prior art has not investigated or considered selecting the value of other laser parameters, such as an impurity carrier concentration in an upper cladding layer of the laser, to minimize input drive power or to maximize conversion efficiency.

SUMMARY OF THE INVENTION

The present invention has been made with such points in view. It therefore is an object of the present invention to provide, in implementation of a semiconductor laser apparatus adapted for a desirable optical output power, a semiconductor laser apparatus having its electric drive power rendered minimal or its photoelectric conversion efficiency rendered maximal, as well as a fabrication method of the same, and a semiconductor laser module with the same. (The photoelectric conversion efficiency is the energy conversion efficiency of electrical power to optical power.)

To achieve the object, according to a first aspect of the invention, there is provided a semiconductor laser apparatus wherein a respective element value of the semiconductor laser apparatus is determined on the basis of relationships between respective elements of the semiconductor laser apparatus including a cavity length of the semiconductor laser apparatus and a carrier concentration of an upper cladding layer of the semiconductor laser apparatus and a photoelectric conversion efficiency or electric drive power of the semiconductor laser apparatus, for optical output power to be constant as a parameter, so that the electric drive power is vicinal to a minimum thereof or the photoelectric conversion efficiency is vicinal to a maximum thereof in correspondence to a desirable optical output power. An exemplary vicinal value is preferably within 10% of the minimum of the drive power and within 10% of the maximum of the conversion efficiency, and more preferably within 6% thereof, and most preferably within 3% thereof.

According to the first aspect of the invention, by implementation of a semiconductor laser apparatus wherein a respective element value of the semiconductor laser apparatus is determined on the basis of relationships between respective elements of the semiconductor laser apparatus including a cavity length of the semiconductor laser apparatus and a carrier concentration of an upper cladding layer of the semiconductor laser apparatus and a photoelectric conversion efficiency or electric drive power of the semiconductor laser apparatus, for optical output power to be constant as a parameter, so that the electric drive power is vicinal to a minimum thereof or the photoelectric conversion efficiency is vicinal to a maximum thereof in correspondence to a desirable optical output power, it is enabled to obtain an desirable optical output power in a range over 50 mW, with a photoelectric conversion efficiency in a vicinity of a maximum or electric drive power in a vicinity of a minimum.

According to the second aspect of the invention, there is provided a semiconductor laser apparatus wherein a cavity length over 1000 $\mu$m is determined on the basis of a relationship of electric drive power to a range of optical output power over 50 mW, for cavity length to be constant as a parameter in a range over 1000 $\mu$m, so that the electric drive power is vicinal to a minimum thereof in correspondence to a desirable optical output power.

According to the second aspect of the invention, by implementation of a semiconductor laser apparatus wherein a cavity length over 1000 $\mu$m is determined on the basis of a relationship of electric drive power to a range of optical output power over 50 mW, for cavity length to be constant as a parameter in a range over 1000 $\mu$m, so that the electric drive power is vicinal to a minimum thereof in correspondence to a desirable optical output power, it is enabled to obtain an desirable optical output power in a range over 50 mW, with electric drive power in a vicinity of a minimum.

According to a third aspect of the invention, there is provided a semiconductor laser apparatus wherein a cavity length is determined on the basis of a relationship of a photoelectric conversion efficiency to a range of cavity length over 1000 $\mu$m, for optical output power to be constant as a parameter in a range over 50 mW, so that the photoelectric conversion efficiency is vicinal to a maximum thereof in correspondence to a desirable optical output power.

According to the third aspect of the invention, by implementation of a semiconductor laser apparatus wherein a cavity length is determined on the basis of a relationship of a photoelectric conversion efficiency to a range of cavity length over 1000 $\mu$m, for optical output power to be constant as a parameter in a range over 50 mW, so that the photoelectric conversion efficiency is vicinal to a maximum thereof in correspondence to a desirable optical output power, it is enabled to obtain an desirable optical output power in a range over 50 mW, with high photoelectric conversion efficiency.

According to a fourth aspect of the invention, in the above semiconductor laser apparatus, the cavity length is determined on the basis of an approximation expression making the photoelectric conversion efficiency maximal in correspondence to the desirable optical output power.

According to the fourth aspect of the invention, determination of the cavity length is based an approximation expression making the photoelectric conversion efficiency maximal in correspondence to the desirable optical output power.

According to a fifth aspect of the invention, in the above semiconductor laser apparatus, a cavity length over 1000 $\mu$m is determined on the basis of a relationship of electric drive power to a range of cavity length over 1000 $\mu$m, for optical output power to be constant as a parameter in a range over 50 mW, so that the electric drive power is vicinal to a minimum thereof in correspondence to a desirable optical output power.

According to the fifth aspect of the invention, by implementation of a semiconductor laser apparatus having a cavity length over 1000 $\mu$m determined on the basis of a relationship of electric drive power to a range of cavity length over 1000 $\mu$m, for optical output power to be constant as a parameter in a range over 50 mW, so that the electric drive power is vicinal to a minimum thereof in correspondence to a desirable optical output power, it is enabled to obtain an desirable optical output power in a range over 50 mW, with low electric drive power.

According to a sixth aspect of the invention, in the above semiconductor laser apparatus, the cavity length is determined on the basis of an approximation expression making the electric drive power minimal in correspondence to the desirable optical output power.

According to the sixth aspect of the invention, when the cavity length is determined, it is determined on the basis of an approximation expression making an electric drive power minimal in correspondence to the desirable optical output power.

According to a seventh aspect of the invention, in the above semiconductor laser apparatus, an active layer forming a cavity with the cavity length has a strain multiple quantum well structure.

According to the seventh aspect of the invention, as an active layer forming a cavity with the cavity length, there is applied a strain multiple quantum well structure, while it is enabled even for the semiconductor laser apparatus having a strain multiple quantum well structure to obtain an desirable optical output power in a range over 50 mW, with high photoelectric conversion efficiency or low electric drive power.

According to an eighth aspect of the invention, in the above semiconductor laser apparatus, the desirable optical output power is within a range of 50 mW to 400 mW, and the cavity length is within a range of 1000 $\mu$m to 1800 $\mu$m, and more preferably within a range of 1000 $\mu$m to 1600 $\mu$m.

According to the eighth aspect of the invention, there is implemented a concrete semiconductor laser apparatus to be distinctive, particularly when letting the desirable optical output power be within a range of 50 mW to 400 mW and the cavity length be within a range of 1000 $\mu$m to 1800 $\mu$m, and more preferably within a range of 1000 $\mu$m to 1600 $\mu$m, and determining the cavity length simply from the relationship of the electric drive power to the optical output power.

According to a ninth aspect of the invention, in the above semiconductor laser apparatus, the desirable optical output power is within a range of 50 mW to 200 mW, and the cavity length is within a range of 1000 $\mu$m to 1400 $\mu$m.

According to the ninth aspect of the invention, there is implemented a concrete semiconductor laser apparatus to be distinctive, particularly when letting the desirable optical output power be within a range of 50 mW to 200 mW and the cavity length be within a range of 1000 $\mu$m to 1400 $\mu$m, and determining the cavity length simply from the relationship of the electric drive power to the optical output power.

According to a tenth aspect of the invention, in the semiconductor laser apparatus, an upper cladding layer has an impurity carrier concentration determined on the basis of a relationship of a photoelectric conversion efficiency or electric drive power to the impurity carrier concentration of the upper cladding layer, for optical output power and cavity length to be constant as parameters, so that the electric drive power is vicinal to a minimum thereof or the photoelectric conversion efficiency is vicinal to a maximum thereof in correspondence to a desirable optical output power.

According to the tenth aspect of the invention, by implementation of a semiconductor laser apparatus, an upper cladding layer has an impurity carrier concentration determined on the basis of a relationship of a photoelectric conversion efficiency or electric drive power to the impurity carrier concentration of the upper cladding layer, for optical output power and cavity length to be constant as parameters, so that the electric drive power is vicinal to a minimum thereof or the photoelectric conversion efficiency is vicinal to a maximum thereof in correspondence to a desirable optical output power, it is enabled to obtain an desirable optical output power in a range over 50 mW, with a photoelectric conversion efficiency in a vicinity of a maximum or electric drive power in a vicinity of a minimum.

According to an eleventh aspect of the invention, there is provided a semiconductor laser module comprising a semiconductor laser apparatus according to any of the first to tenth aspects of the invention, an optical fiber for conducting outside laser light projected from the semiconductor laser apparatus, and an optical coupling lens system for an optical coupling between the semiconductor laser apparatus and the optical fiber.

According to the eleventh aspect of the invention, by implementation of a semiconductor laser module with an incorporated semiconductor laser apparatus according to any of the first to tenth aspects of the invention, it is enabled to obtain an desirable optical output power, with high photoelectric conversion efficiency or low electric drive power.

According to a twelfth aspect of the invention, the above semiconductor laser module further comprises a temperature controller for controlling a temperature of the semiconductor laser apparatus, and an optical fiber grating formed in a vicinity of an incidence end of the optical fiber.

According to the twelfth aspect of the invention, an optical fiber grating is formed in a vicinity of an incidence end of the optical fiber, and laser light of a wavelength selected by the optical fiber grating is output.

According to a thirteenth aspect of the invention, the above semiconductor laser module further comprises a temperature controller for controlling a temperature of the semiconductor laser apparatus, and an isolator disposed in the optical coupling lens system, for suppressing an incidence of reflection return light from an optical fiber side.

According to the thirteenth aspect of the invention, by implementation of a semiconductor laser module with an incorporated semiconductor laser apparatus according to any of the first to tenth aspects of the invention, it is enabled even for the semiconductor laser module with an incorporated temperature controller to obtain an desirable optical output power, with high photoelectric conversion efficiency or low electric drive power.

According to a fourteenth aspect of the invention, there is provided a fabrication method for a semiconductor laser apparatus, comprising a relationship acquiring step for acquiring relationships between respective elements of the semiconductor laser apparatus including a cavity length of the semiconductor laser apparatus and a carrier concentration of an upper cladding layer of the semiconductor laser apparatus and a photoelectric conversion efficiency or electric drive power of the semiconductor laser apparatus, for optical output power to be constant as a parameter, an element value determining step for determining a respective element value of the semiconductor laser apparatus to be determined on the basis of the relationships acquired by the relationship acquiring step, so that the electric drive power is vicinal to a minimum thereof or the photoelectric conversion efficiency is vicinal to a maximum thereof in correspondence to a desirable optical output power, and a forming step for forming the semiconductor laser apparatus having the respective element value determined by the element value determining step.

According to the fourteenth aspect of the invention, for fabrication of a semiconductor laser apparatus, in a relationship acquiring step there are acquired relationships between respective elements of the semiconductor laser apparatus including a cavity length of the semiconductor laser apparatus and a carrier concentration of an upper cladding layer of the semiconductor laser apparatus and a photoelectric conversion efficiency or electric drive power of the semiconductor laser apparatus, for optical output power to be constant as a parameter, in an element value determining step there is determined a respective element value of the semiconductor laser apparatus to be determined on the basis of the relationships acquired by the relationship acquiring step, so that the electric drive power is vicinal to a minimum thereof or the photoelectric conversion efficiency is vicinal to a maximum thereof in correspondence to a desirable optical output power, and in a forming step there is formed the semiconductor laser apparatus having the respective element value determined by the element value determining step.

According to a fifteenth aspect of the invention, there is provided a fabrication method for a semiconductor laser apparatus, comprising a relationship acquiring step for acquiring a relationship of electric drive power to a range of optical output power power over 50 mW, for cavity length to be constant as a parameter in a range over 1000 $\mu$m, a cavity length determining step for determining a cavity length over 1000 $\mu$m to be determined on the basis of the relationship acquired by the relationship acquiring step, so that the electric drive power is vicinal to a minimum thereof in correspondence to a desirable optical output power, and a forming step for forming the semiconductor laser apparatus having the cavity length determined by the cavity length determining step.

According to the fifteenth aspect of the invention, for fabrication of a semiconductor laser apparatus, in a relationship acquiring step there is acquired a relationship of electric drive power to a range of optical output power over 50 mW, for cavity length to be constant as a parameter in a range over 1000 $\mu$m, in a cavity length determining step there is determined a cavity length over 1000 $\mu$m to be determined on the basis of the relationship acquired by the relationship acquiring step, so that the electric drive power is vicinal to a minimum thereof in correspondence to a desirable optical output power, and in a forming step there is formed the semiconductor laser apparatus having the cavity length determined by the cavity length determining step.

According to a sixteenth aspect of the invention, there is provided a fabrication method for a semiconductor laser apparatus, comprising a relationship acquiring step for acquiring a relationship of a photoelectric conversion efficiency to a range of cavity length over 1000 μm, for optical output power to be constant as a parameter in a range over 50 mW, a cavity length determining step for determining a cavity length to be determined on the basis of the relationship acquired by the relationship acquiring step, so that the photoelectric conversion efficiency is vicinal to a maximum thereof in correspondence to a desirable optical output power, and a forming step for forming the semiconductor laser apparatus having the cavity length determined by the cavity length determining step.

According to the sixteenth aspect of the invention, for fabrication of a semiconductor laser apparatus, in a relationship acquiring step there is acquired a relationship of a photoelectric conversion efficiency to a range of cavity length over 1000 μm, for optical output power to be constant as a parameter in a range over 50 mW, in a cavity length determining step there is determined a cavity length to be determined on the basis of the relationship acquired by the relationship acquiring step, so that the photoelectric conversion efficiency is vicinal to a maximum thereof in correspondence to a desirable optical output power, and in a forming step there is formed the semiconductor laser apparatus having the cavity length determined by the cavity length determining step.

According to a seventeenth aspect of the invention, the above fabrication method for a semiconductor laser apparatus further comprises an approximation expression calculating step for determining an approximation expression for making the photoelectric conversion efficiency maximal in correspondence to the desirable optical output power, on the basis of the relationship acquired by the relationship acquiring step, and the cavity length determining step determining the cavity length on the basis of the approximation expression.

According to the seventeenth aspect of the invention, an approximation expression calculating step determines an approximation expression for making the photoelectric conversion efficiency maximal in correspondence to the desirable optical output power, on the basis of the relationship acquired by the relationship acquiring step, and the cavity length determining step determines the cavity length on the basis of the approximation expression.

According to an eighteenth aspect of the invention, there is provided a fabrication method for a semiconductor laser apparatus, comprising a relationship acquiring step for acquiring a relationship of electric drive power to a range of cavity length over 1000 μm, for optical output power to be constant as a parameter in a range over 50 mW, a cavity length determining step for determining a cavity length over 1000 μm to be determined on the basis of the relationship acquired by the relationship acquiring step, so that the electric drive power is vicinal to a minimum thereof in correspondence to a desirable optical output power, and a forming step for forming the semiconductor laser apparatus having the cavity length determined by the cavity length determining step.

According to the eighteenth aspect of the invention, for fabrication of a semiconductor laser apparatus, in a relationship acquiring step there is acquired a relationship of electric drive power to a range of cavity length over 1000 μm, for optical output power to be constant as a parameter in a range over 50 mW, in a cavity length determining step there is determined a cavity length over 1000 μm to be determined on the basis of the relationship acquired by the relationship acquiring step, so that the electric drive power is vicinal to a minimum thereof in correspondence to a desirable optical output power, and in a forming step there is formed the semiconductor laser apparatus having the cavity length determined by the cavity length determining step.

According to a nineteenth aspect of the invention, the above fabrication method for a semiconductor laser apparatus further comprises an approximation expression calculating step for determining an approximation expression for making the electric drive power minimal in correspondence to the desirable optical output power, on the basis of the relationship acquired by the relationship acquiring step, and the cavity length determining step determining the cavity length on the basis of the approximation expression.

According to the nineteenth aspect of the invention, an approximation expression calculating step determines an approximation expression for making the electric drive power minimal in correspondence to the desirable optical output power, on the basis of the relationship acquired by the relationship acquiring step, and the cavity length determining step determines the cavity length on the basis of the approximation expression.

According to a twentieth aspect of the invention, in the above fabrication method for a semiconductor laser apparatus, an active layer forming a cavity with the cavity length has a strain multiple quantum well structure.

According to the twentieth aspect of the invention, as an active layer forming a cavity with the cavity length there is applied a strain multiple quantum well structure, while it is enabled even for the semiconductor laser apparatus having a strain multiple quantum well structure to obtain an desirable optical output power in a range over 50 mW, with high photoelectric conversion efficiency or low electric drive power.

According to a twenty-first aspect of the invention, there is provided a fabrication method for a semiconductor laser apparatus, comprising a relationship acquiring step for acquiring a relationship of electric drive power to an impurity carrier concentration of an upper cladding layer, for optical output power and cavity length to be constant as parameters, a carrier concentration determining step for determining the impurity carrier concentration to be determined on the basis of the relationship acquired by the relationship acquiring step, so that the electric drive power is vicinal to a minimum thereof in correspondence to a desirable optical output power; and a forming step for forming the semiconductor laser apparatus with the upper cladding layer having the impurity carrier concentration thereof set to the impurity carrier concentration determined by the carrier concentration determining step.

According to the twenty-first aspect of the invention, for fabrication of a semiconductor laser apparatus, in a relationship acquiring step there is acquired a relationship of electric drive power to an impurity carrier concentration of an upper cladding layer, for optical output power and cavity length to be constant as parameters, in a carrier concentration determining step there is determined the impurity carrier concentration to be determined on the basis of the relationship acquired by the relationship acquiring step, so that the electric drive power is vicinal to a minimum thereof in correspondence to a desirable optical output power, and in a forming step there is formed the semiconductor laser apparatus with the upper cladding layer having the impurity carrier concentration thereof set to the impurity carrier concentration determined by the carrier concentration determining step.

Other objects and features of this invention will become understood from the following description with reference to the accompanying drawings.

BRIEF DESCRIPTION OF THE DRAWINGS

The above and further objects and novel features of the present invention will more fully appear from the following detailed description when the same is read in conjunction with the accompanying drawings, in which:

FIG. 16 is a graph of ranges of cavity length L for an exemplary category of semiconductor lasers which results in an input driving current that is within approximately 5% to approximately 10% of the minimum driving current for a given value of optical output power $P_{OUT}$ in the range between 50 mW and 390 mW, according to the present invention.

DESCRIPTION OF THE PREFERRED EMBODIMENTS

There will be detailed below the preferred embodiments of a semiconductor laser apparatus and a fabrication method of the same, and a semiconductor laser module according to the present invention, with reference made to the accompanying drawings.

First Embodiment

Figure 1:
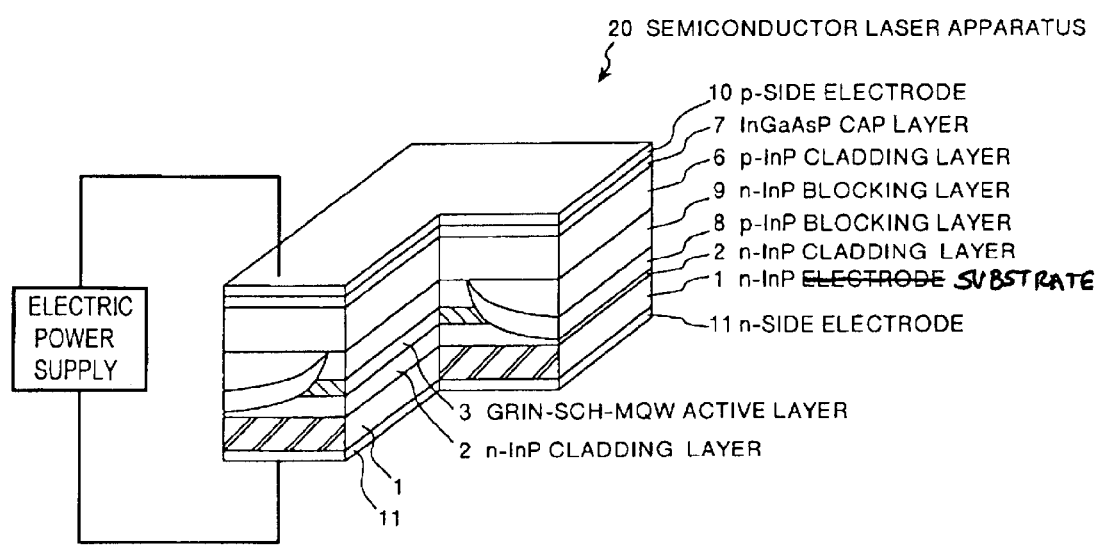
FIG. 1 is a broken perspective view of a semiconductor laser apparatus according to an embodiment of the invention.
Figure 2:
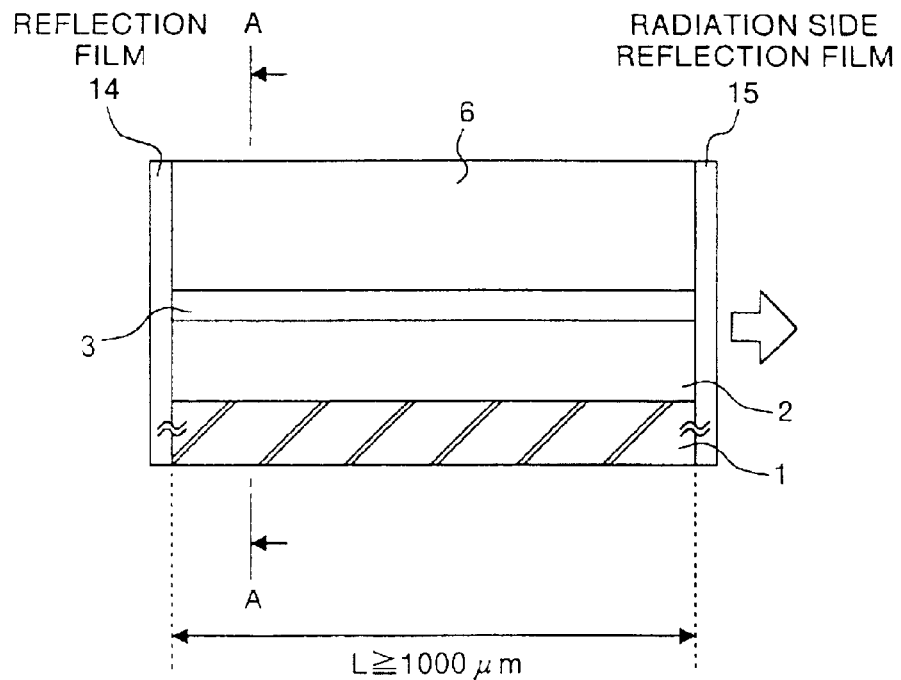
FIG. 2 is a schematic longitudinal sectional view of the semiconductor laser apparatus of FIG. 1.
Figure 3:
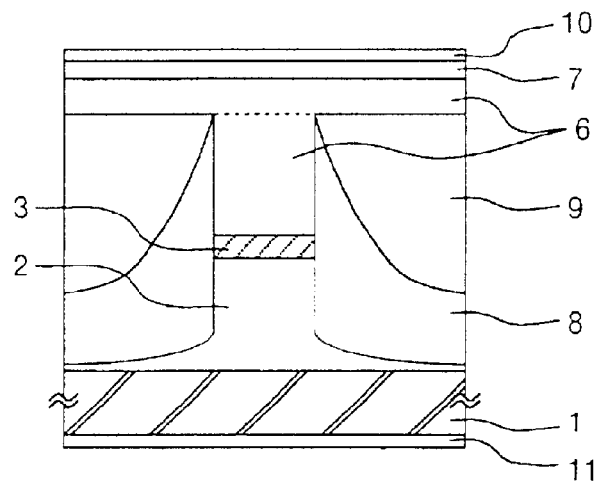
FIG. 3 is a sectional view along line A—A of the semiconductor laser apparatus of FIG. 1.

First, description is made of a first embodiment of the invention. FIG. 1 is a broken perspective view of a schematic arrangement of a semiconductor laser apparatus according to the first embodiment of the invention, FIG. 2, a longitudinal sectional view of the semiconductor laser apparatus of FIG. 1, and FIG. 3, a sectional view along line A—A of the semiconductor laser apparatus of FIG. 2. As in FIG. 1 to FIG. 3, this semiconductor laser apparatus 20 has laminated on a surface of an n-InP substrate 1, in sequence, an n-InP cladding layer 2 concurrently serving as a buffer layer and a lower cladding layer by n-InP, a GRIN-SCH-MQW (Graded Index-Separate Confinement Heterostructure Multi Quantum Well) active layer 3 with compression strains, a p-InP clad layer 6, and an InGaAsP cap layer 7.

Part of the p-InP cladding layer 6, the GIN-SCH-MQW active layer 3, and an upper part of the n-InP cladding layer 2 are processed in a mesa stripe form, and both sides of the mesa stripe are buried by a p-InP blocking layer 8 and an n-InP blocking layer 9 that are formed as current blocking layers. Upside of the InGaAs cap layer 7 is formed a p-side electrode 10, and downside of the n-InP substrate 1 is formed an n-side electrode 11.

On a light reflective rear facet as one facet in a longitudinal direction of the semiconductor laser apparatus 20 is formed a reflective film 14 with a high light reflectivity of over a 80%, and on a light emitting front facet as the other facet is formed a low reflectivity film 15 with a reflectivity within a range of 1% to 5%, and preferably less than 4%. Light is generated in the GRIN-SCH-MQW active layer 3 and amplified in the cavity formed by the rear facet and the front facet, and is emitted as laser light through the front facet.

The GRIN-SCH layer comprises two quaternary GaInAsP layers of bandgap-wavelength of 1.1 μm and 1.2 μm, total thickness of about 40 nm for each side. Well layers of MQW comprise 4 nm-thick quaternary GaInAsP layers with in-plane compressive strain of about 1%. Barrier layers of MQW comprise quaternary GaInAsP layers of bandgap-wavelength of 1.2 μm, thickness of 10 nm each. Other conditions for the well thickness larger than 3.4 nm and strain amount larger than 0.5% can be adopted so far as desired lasing wavelength can be obtained. The layer structure for the GRIN-SCH layers can also be modified in the range of total thickness of 20–50 nm.

The GRIN-SCH-MQW active layer 3 has its longitudinal length as a cavity length L to be set 1000 μm or greater. Optical output power from the semiconductor laser apparatus 20 is set to be 50 mW or greater.

Figure 4:
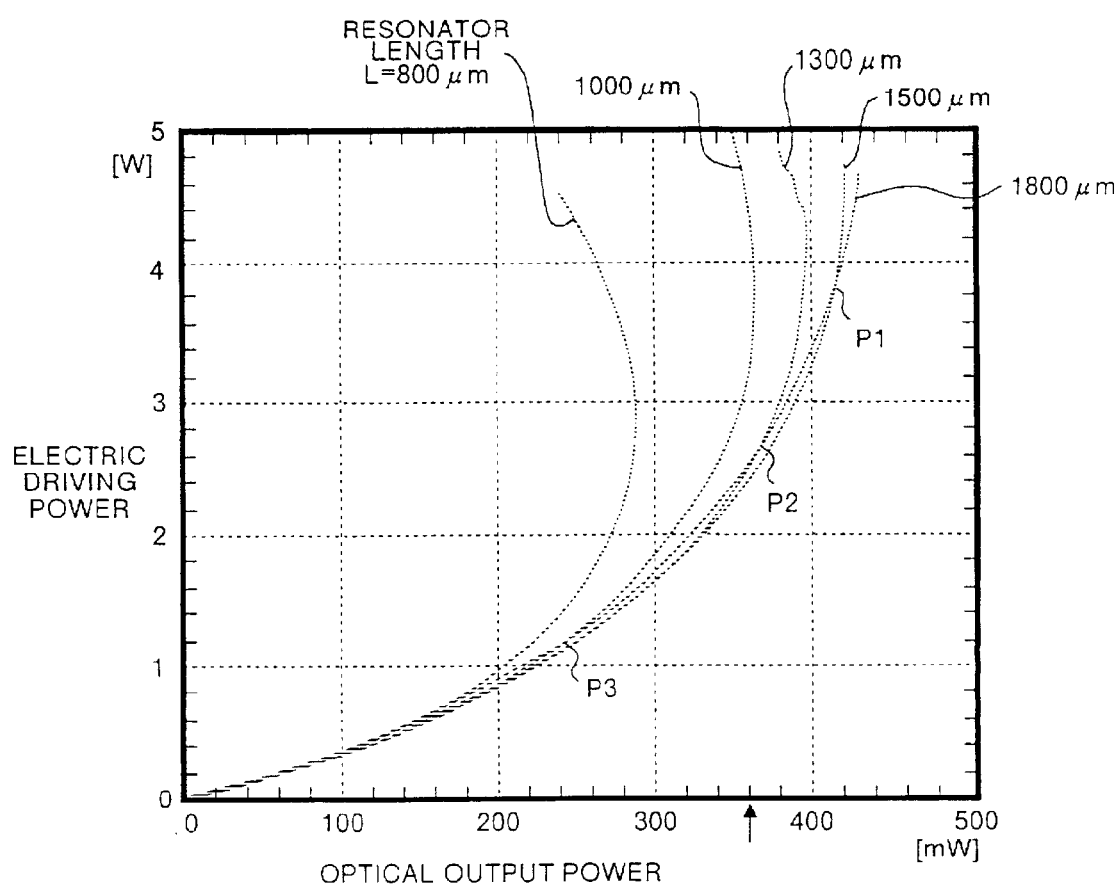
FIG. 4 is a graph showing a relationship of electric drive power to an optical output power for cavity length taken as a parameter, and applicable to the semiconductor laser apparatus of FIG. 1.

The cavity length L of the semiconductor laser apparatus shown in FIG. 1 is determined on the basis of a relationship shown in FIG. 4. FIG. 4 is a graph showing a relationship of electric drive power to an optical output power for cavity length taken as a parameter. FIG. 4 shows the relationship between drive power and optical output power for cavity lengths of 800 μm, 1000 μm, 1300 μm, 1500 μm, and 1800 μm, on the assumption that the semiconductor laser apparatus 20 has a structure shown in FIG. 1.

As in FIG. 4, in general, semiconductor laser apparatus short of cavity length needs greater electric drive power to obtain a specified optical output power, in comparison with semiconductor laser apparatus long of cavity length. However, comparison between cavity lengths 1500 μm and 1800 μm shows an inversion in a vicinity (P1) of a 420 mW optical output power, revealing that, for an optical output power to be 420 mW or greater, a semiconductor laser apparatus with the longer cavity length 1800 μm suffices with lower drive power. Likewise, comparison between cavity lengths 1300 μm and 1800 μm shows an inversion in a vicinity (P2) of a 350 mW optical output power, revealing that, for an optical output power to be 350 mW or greater, a semiconductor laser apparatus with the longer cavity length 1800 μm suffices with lower drive power. Still more, comparison between cavity lengths 1000 μm and 1800 μm shows an inversion in a vicinity (P3) of a 250 mW optical output power, revealing that, for an optical output power to be 250 mW or greater, a semiconductor laser apparatus with the longer cavity length 1800 μm suffices with lower drive power. In other words, for a specified optical output power to be obtained, the cavity length has an optimal value for the drive power to be minimal, which is variable with the specified value of optical output power.

Figure 14:
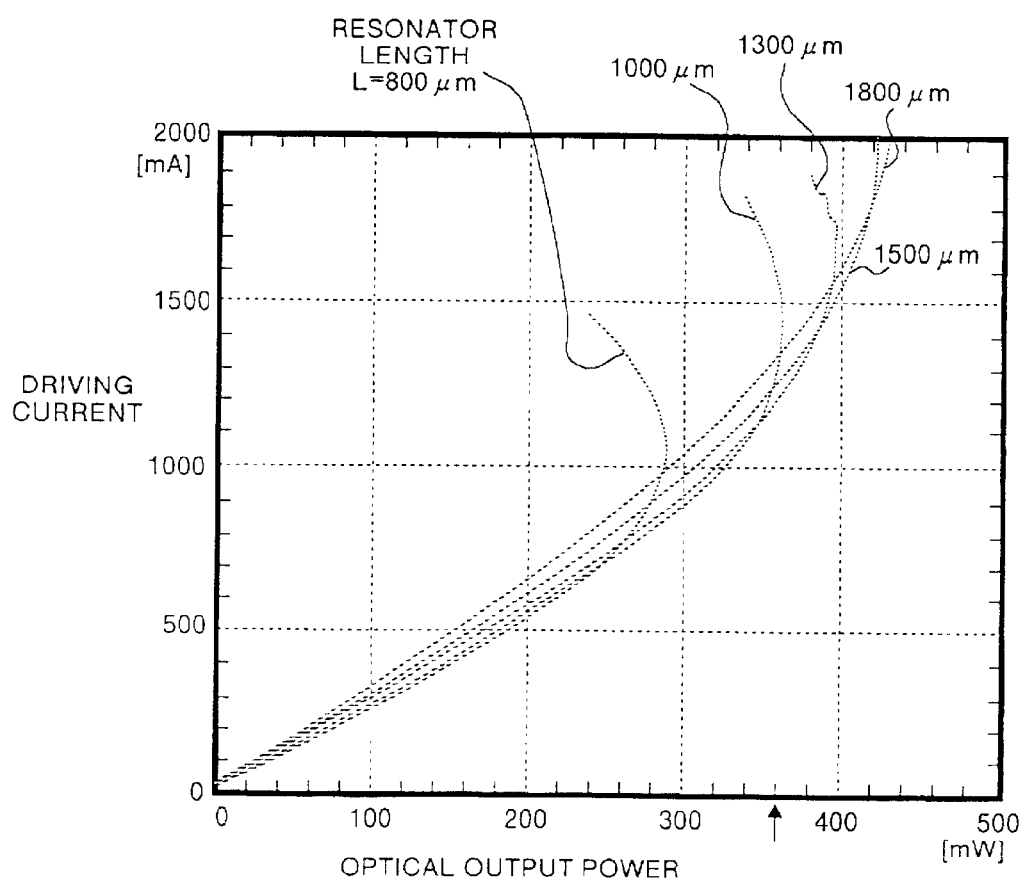
FIG. 14 is a graph showing a relationship of a driving current to an optical output power for cavity length to be constant as a parameter, as it has been employed for determination of the cavity length of a conventional semiconductor laser apparatus.

It is now supposed that the cavity length was selected on the basis of a conventional relationship of driving current to optical output power shown in FIG. 14. Because it was assumed in the past that the smaller the driving current of a semiconductor laser apparatus was, the smaller the drive power of the semiconductor laser apparatus should have been, there were to be selected a cavity length of 800 μm for a range of optical output power up to approx. 220 mW, a cavity length of 1000 μm for a range of optical output power between approx. 220 mW to approx. 350 mW, and a cavity length of between 1100 μm and slightly less than 1300 μm for a range of optical output power between approx. 350 mW to approx. 380 mW. For the last range, we have interpolated between the curves for 1000 μm and 1300 μm due to the increasing slope of the curves. The prior art has not been particularly successful in going beyond the 380 mW power level with the cavity length between 1300 μm and 2000 μm.

Therefore, in order to obtain a semiconductor laser apparatus of a 360 mW optical output power for example, the cavity length in the past was determined as a value around 1200 μm. In actuality, however, using a cavity length of 1500 μm based on the relationship of FIG. 4 could have sufficed the driving with smaller drive power. The cavity length selection and determination in the past might have been thus inadequate.

To the contrary, in the first embodiment, as shown in FIG. 4, the cavity length is determined, on the basis of a relationship of electric drive power to optical output power for cavity length taken as a parameter, so that, among cavity lengths allowing for a desirable optical output power to be obtained, that one which provides the smallest drive power is selected, thus always permitting implementation of a semiconductor laser apparatus small of electric drive power.

In the first embodiment, the cavity length is determined so as to have minimal electric drive power for a desirable optical output power to be obtained by the semiconductor laser apparatus 20 using the GRIN-SCH-MQW active layer 3 which has compression strains, whereas without limitation thereto it can be applied to other semiconductor laser apparatus different in structure.

Figure 5:
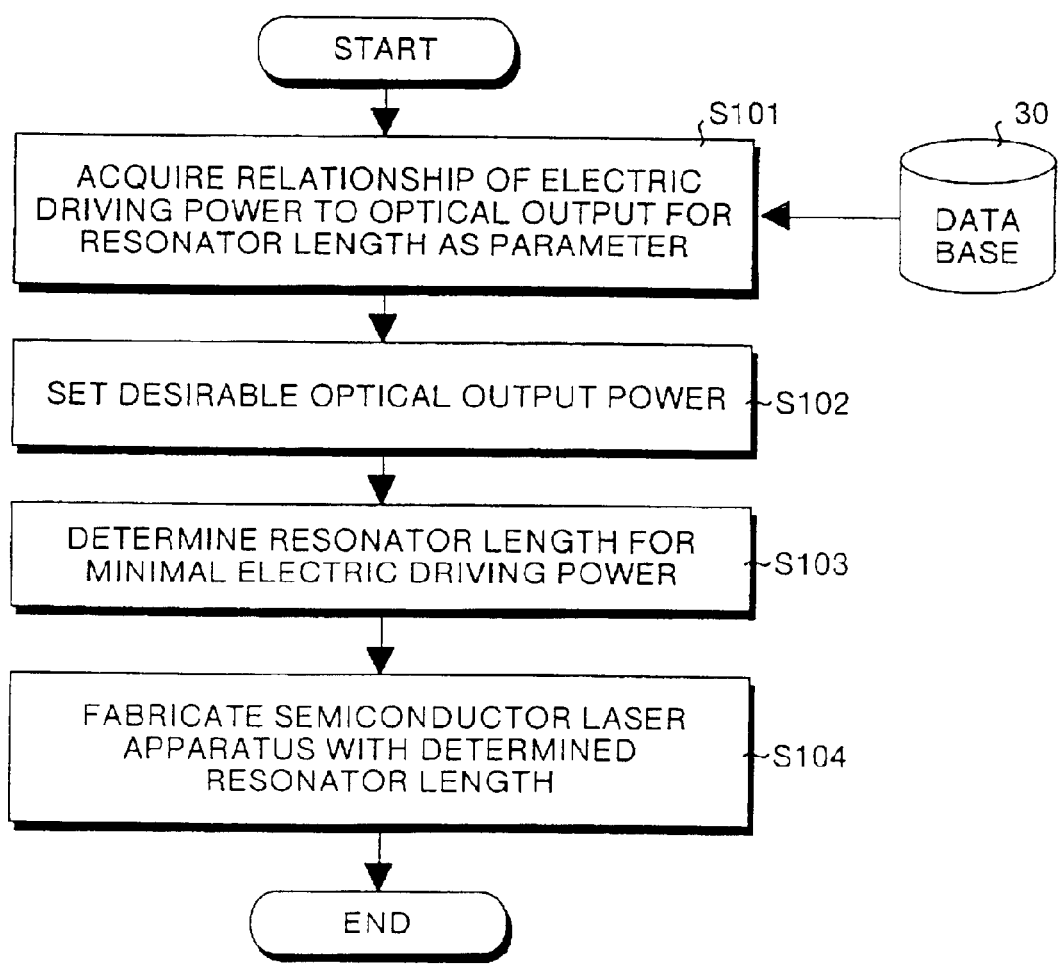
FIG. 5 is a flowchart showing a fabrication method of a semiconductor laser apparatus configured on the basis of the relationship shown in FIG. 4.

Referring now to the flowchart of FIG. 5, description is made of a fabrication method for a semiconductor laser apparatus according to the first embodiment. In FIG. 5, there is first acquired from a data base 30 a relationship of drive power to optical output power for cavity length taken as a parameter (step S101), that is, the relationship shown in FIG. 4. Thereafter, a desirable optical output power is set (step S102), and a cavity length having minimal drive power is determined in correspondence to the set desirable optical output power (step S103). Thereafter, a semiconductor laser apparatus that has the determined cavity length is fabricated (step S104), before the process ends.

In the first embodiment, there described five parameters as cavity lengths of 800 μm, 1000 μm, 1300 μm, 1500 μm, and 1800 μm, whereas, without limitation thereto, for other cavity lengths also, a relationship of electric drive power to optical output power may be determined, or interpolated, to thereby have a more detail cavity length determined with high precision. In this case, the cavity length to be determined may not be a cavity length corresponding to a minimum value of drive power, but may preferably be under a cavity length for specified drive power.

Further, in the first embodiment, characteristic curves in FIG. 4 are complemented with theoretical values on concrete empirical values, whereas their certainty may well be enhanced by obtaining the more empirical values.

Second Embodiment

Next, description is made of a second embodiment of the invention. Although, in the first embodiment, a relationship between drive power and optical output power shown in FIG. 4 is used to determine a cavity length to have minimal drive power for a desirable optical output power, the second embodiment employs a relationship of photoelectric conversion efficiency to cavity length for optical output power taken as a parameter, to be used to determine a cavity length in correspondence to a maximal photoelectric conversion efficiency.

Figure 6:
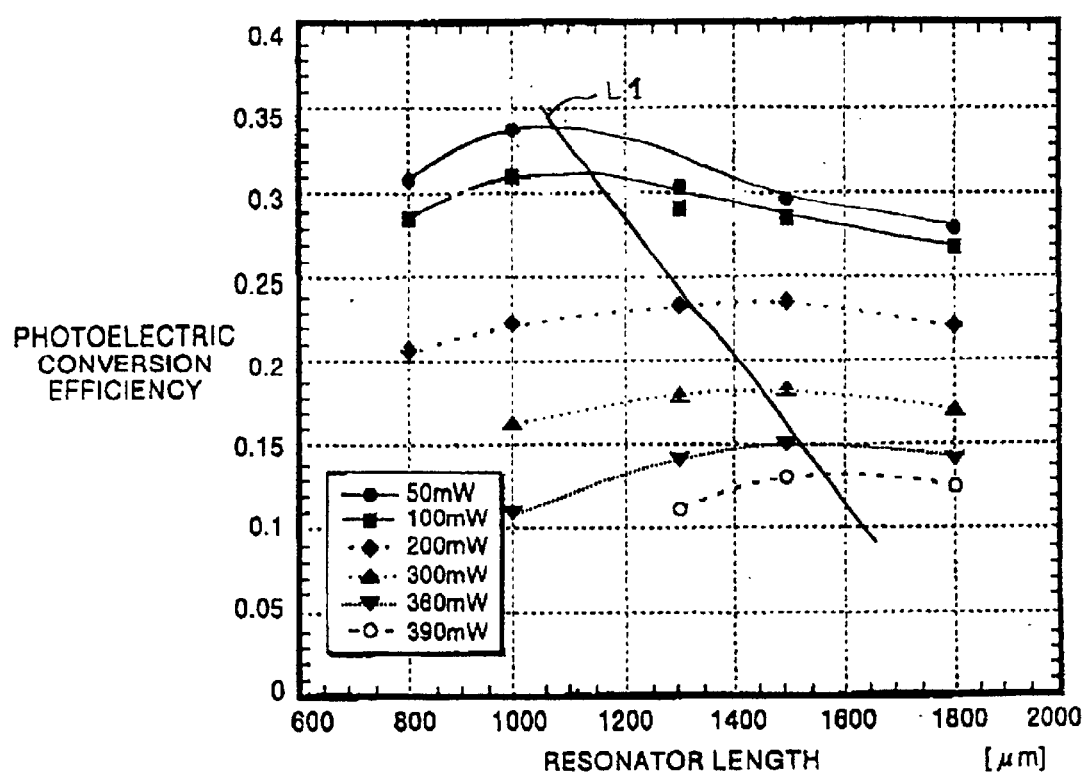
FIG. 6 is a graph showing a relationship of a photoelectric conversion efficiency to a cavity length for optical output power taken as a parameter, and applicable to the semiconductor laser apparatus of FIG. 1.

As shown in FIG. 6, in determination of a relationship of photoelectric conversion efficiency to cavity length for optical output power taken as a parameter, there appears an optical value to have the photoelectric conversion efficiency maximal for a respective optical output power. Therefore, by determining a cavity length corresponding to a point where the photoelectric conversion efficiency has a maximum value for a desirable optical output power, there can be determined a cavity length that renders the photoelectric conversion efficiency maximal, so that a semiconductor laser apparatus implemented with this cavity length can serve as a semiconductor laser apparatus high of photoelectric conversion efficiency. For photoelectric conversion efficiency to be high means for electric drive power to be minimal (i.e., high conversion efficiency implies low electric drive power).

For example, in FIG. 6, for an optical output power of 360 mW to be obtained, the maximum value of photoelectric conversion efficiency is 0.15, when the cavity length is 1500 μm. Therefore, by giving the cavity length of 1500 μm, there can be implemented a semiconductor laser apparatus of a 360 mW optical output power with the highest photoelectric conversion efficiency. Further, for an optical output power of 50 mW to be obtained, the maximum value of photoelectric conversion efficiency is 0.34, when the cavity length is 1000 μm. Therefore, by giving the cavity length of 1000 μm, there can be implemented a semiconductor laser apparatus of a 50 mW optical output power with the highest photoelectric conversion efficiency.

Figure 7:
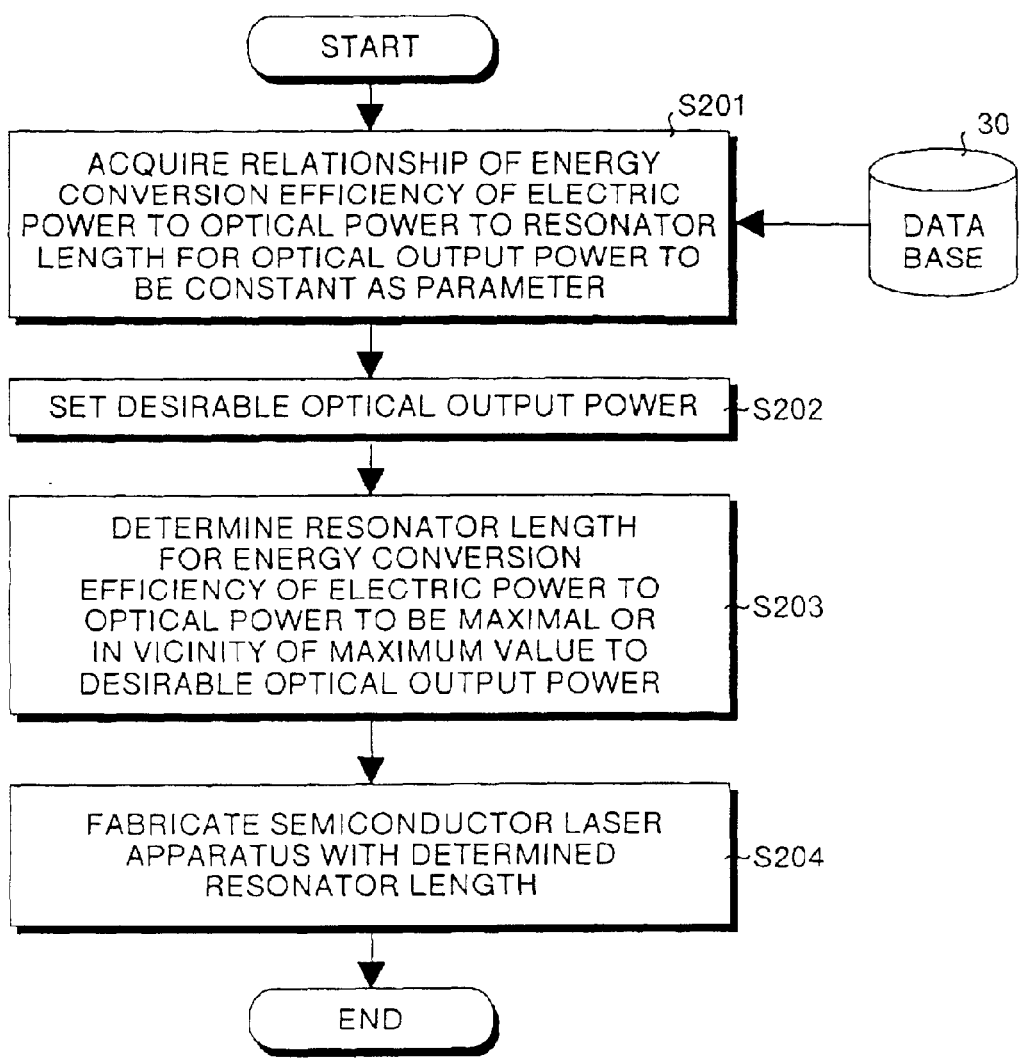
FIG. 7 is a flowchart showing a fabrication method of a semiconductor laser apparatus configured on the basis of the relationship shown in FIG. 6.

Referring now to the flowchart of FIG. 7, description is made of a fabrication method for a semiconductor laser apparatus according to the second embodiment. In FIG. 7, there is first acquired from a data base 30 a relationship of photoelectric conversion efficiency to cavity length for a specified optical output power as a parameter (step S201), that is, the relationship shown in FIG. 6. Thereafter, a desirable optical output power is set (step S202), and a cavity length having a photoelectric conversion efficiency as a maximal or in a vicinity of a maximum is determined in correspondence to the set desirable optical output power (step S203). Thereafter, a semiconductor laser apparatus that has the determined cavity length is fabricated (step S204), before the process ends.

The relationship between cavity length and optical output power for a maximal photoelectric conversion efficiency shown in FIG. 6 may be based on to obtain an approximation expression L1 representing a relationship between cavity length and optical output power, to thereby determine a cavity length depending on this approximation expression L1. In the approximation expression L1, obtained maximal values are associated by a predetermined approximation expression. The approximation expression L1 represents a relationship between an optical output power and an optical cavity length, and allows for an optimal cavity length to be directly determined by substituting a desirable value for optical output power.

Although, in the second embodiment, there is determined a cavity length to provide a maximal photoelectric conversion efficiency, there may be determined, without limiting thereto, a cavity length for a photoelectric conversion efficiency to be lower than specified, or a cavity length for a photoelectric conversion efficiency to be in a vicinity of a maximum. The vicinity of the maximum may cover cavity lengths within a range specified by a given percentage that corresponds to a photoelectric conversion efficiency of the maximum value, or cavity lengths within a range specified by a given percentage relative to a reference as a cavity length corresponding to a photoelectric conversion efficiency of the maximum value. There may be provided a specified margin for a cavity length determined by the approximation expression L1, as the margin corresponds to a range of the vicinity of maximum. For photoelectric conversion efficiency, the percentage is preferably 10%, and more preferably 6%, and most preferably 3%. For cavity length, the percentage is preferably 40%, and more preferably 20%, and most preferably 10%.

Third Embodiment

Next, description is made a third embodiment of the invention. Although, in the second embodiment, a relationship of photoelectric conversion efficiency to cavity length for optical output power taken as a parameter is based on to determine a cavity length to have maximal photoelectric conversion efficiency for a desirable optical output power, the third embodiment employs a relationship of electric drive power to cavity length for optical output power taken as a parameter, to be based on to determine a cavity length to have minimal drive power for a desirable optical output power to be obtained. That is, the photoelectric conversion efficiency in the second embodiment is rendered to be substantially identical drive power.

Figure 8:
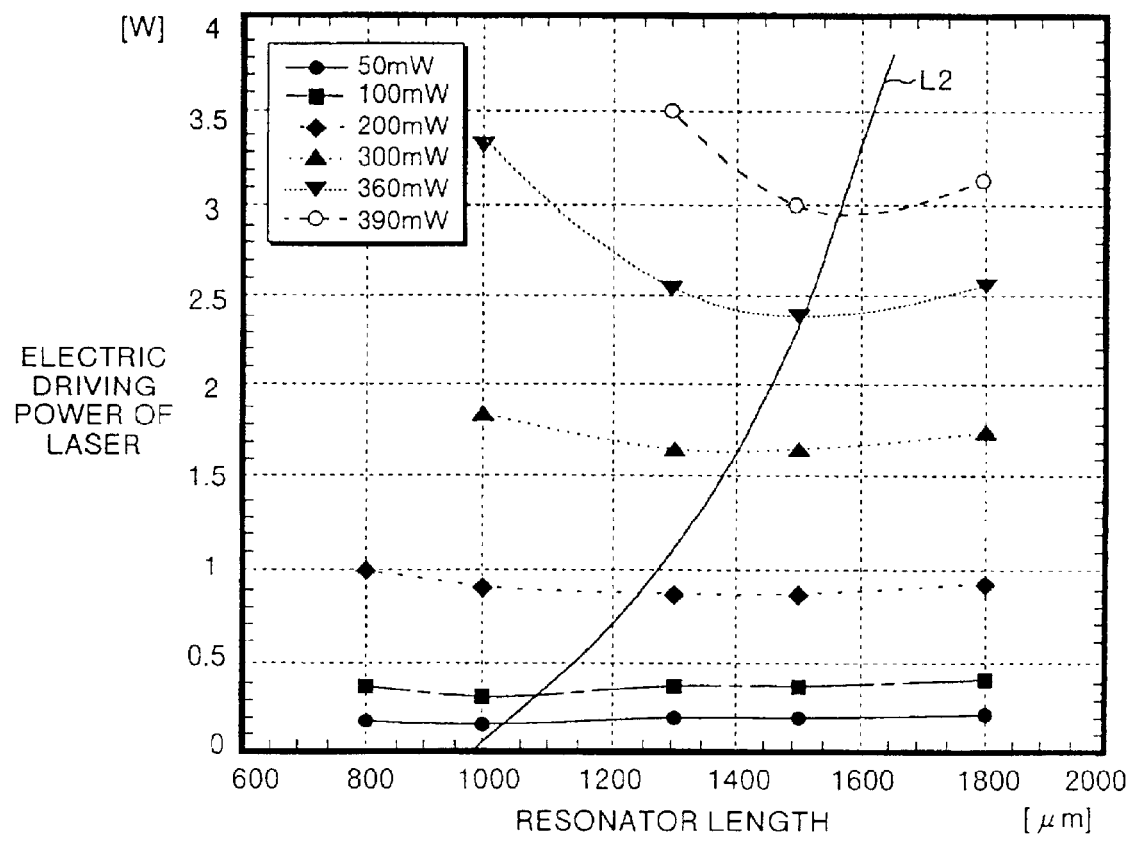
FIG. 8 is a graph showing a relationship of electric drive power to a cavity length for optical output power taken as a parameter, and applicable to the semiconductor laser apparatus of FIG. 1.

FIG. 8 is a graph showing a relationship of electric drive power to a cavity length for optical output power taken as a parameter. In FIG. 8, contrary to the photoelectric conversion efficiency in FIG. 6, electric drive power stands as a characteristic having a minimum value. In FIG. 8, for a respective optical output power, there is a corresponding cavity length for the drive power to have a minimum value. In particular, as the optical output power increases, the minimum value appears more significant. For example, for an optical output power of 360 mW, the minimum value of drive power is 2.4 W, when the cavity length is 1500 $\mu$m. Like this, for a desirable optical output power, there can be determined a cavity length that minimizes the drive power.

Figure 9:
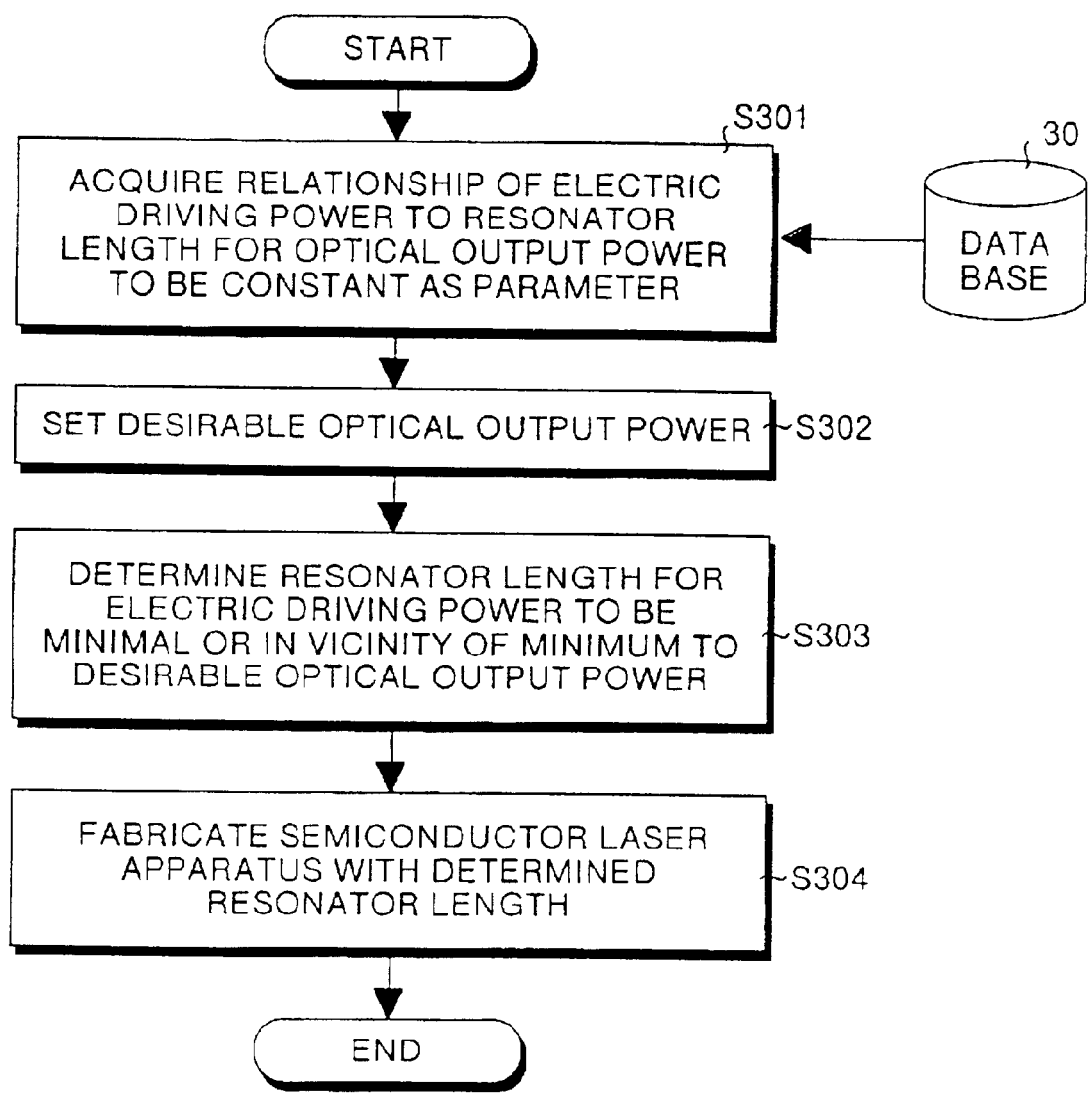
FIG. 9 is a flowchart showing a fabrication method of a semiconductor laser apparatus configured on the basis of the relationship shown in FIG. 8.

Referring now to the flowchart of FIG. 9, description is made of a fabrication method for a semiconductor laser apparatus according to the third embodiment. In FIG. 9, there is first acquired from a data base 30 a relationship of electric drive power to cavity length for a specified optical output power as a parameter (step S301), that is, the relationship shown in FIG. 8. Thereafter, a desirable optical output power is set (step S302), and a cavity length having drive power as a minimal or in a vicinity of a minimum is determined in correspondence to the set desirable optical output power (step S303).

Thereafter, a semiconductor laser apparatus that has the determined cavity length is fabricated (step S304), before the process ends.

The relationship between cavity length and optical output power for minimal drive power shown in FIG. 8 may be based on to obtain an approximation expression L2 representing a relationship between cavity length and optical output power, to thereby determine a cavity length depending on this approximation expression L2. In the approximation expression L2, obtained minimal values are associated by a predetermined approximation expression. The approximation expression L2 represents a relationship between an optical output power and an optical cavity length, and allows for an optimal cavity length to be directly determined by substituting a desirable value for optical output power.

Although, in the third embodiment, there is determined a cavity length to render drive power minimal, there may be determined, without limiting thereto, a cavity length for drive power to be lower than specified, or a cavity length for drive power to be in a vicinity of a minimum. The vicinity of the minimum may cover cavity lengths within a range specified by a given percentage that corresponds to drive power of the minimum value, or cavity lengths within a range specified by a given percentage relative to a reference as a cavity length corresponding to drive power of the maximum value. There may be provided a specified margin for a cavity length determined by the approximation expression L2, as the margin corresponds to a range of the vicinity of minimum. For drive power, the percentage is preferably 10%, and more preferably 6%, and most preferably 3%. For cavity length, the percentage is preferably 40%, and more preferably 20%, and most preferably 10%.

Although, in the foregoing first to third embodiments, the cavity length is described as 1800 $\mu$m at maximum, there may be employed, without limiting thereto, yet longer cavity lengths, as well, to be likewise applied. In particular, when an increased optical output power is desirable, there is required a yet longer cavity length, whereby the semiconductor laser apparatus 20 has increased drive power, with the more enhanced functions and effects to be exhibited in this embodiment.

Fourth Embodiment

Next, description is made a fourth embodiment of the invention. Although, in the foregoing first to third embodiments, there is a cavity length to have minimal electric drive power or maximal photoelectric conversion efficiency for a desirable optical output power, the fourth embodiment is configured to determine, from a desirable optical output power and a specified cavity length, a hole carrier concentration of an upper cladding layer (p-InP cladding layer 6) to have minimal electric drive power.

Figure 10:
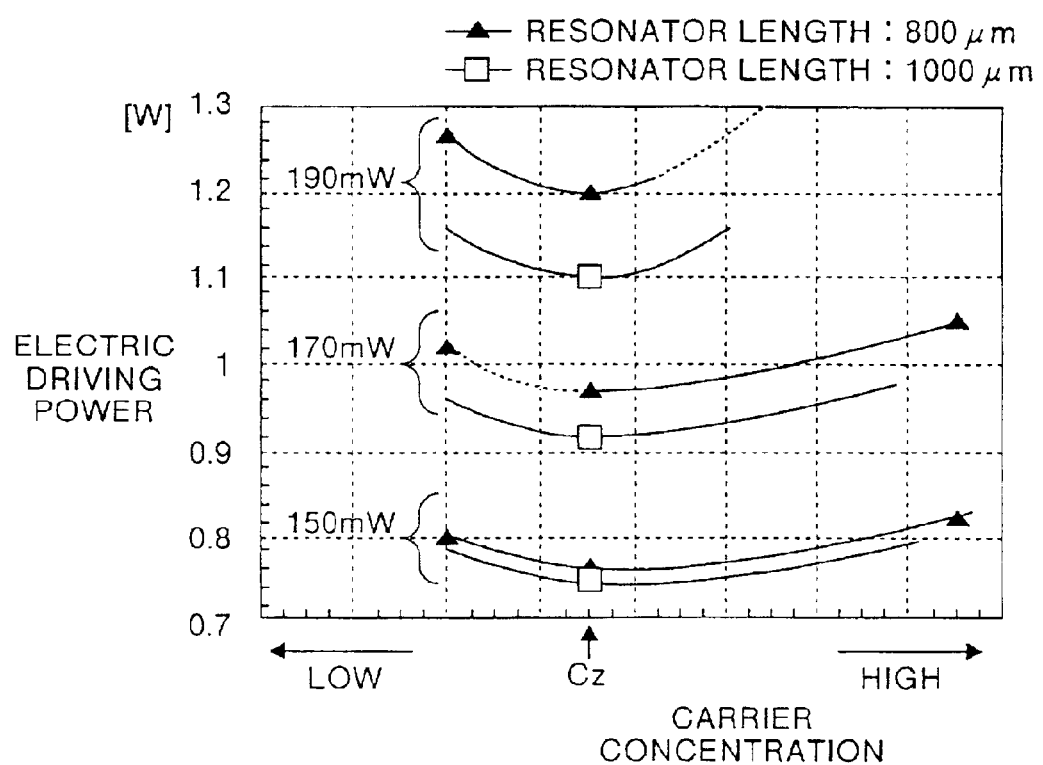
FIG. 10 is a graph showing a relationship of electric drive power to a hole carrier concentration of an upper cladding layer due to Zn doping for optical output power taken as a parameter, and applicable to the semiconductor laser apparatus of FIG. 1.
Figure 15:
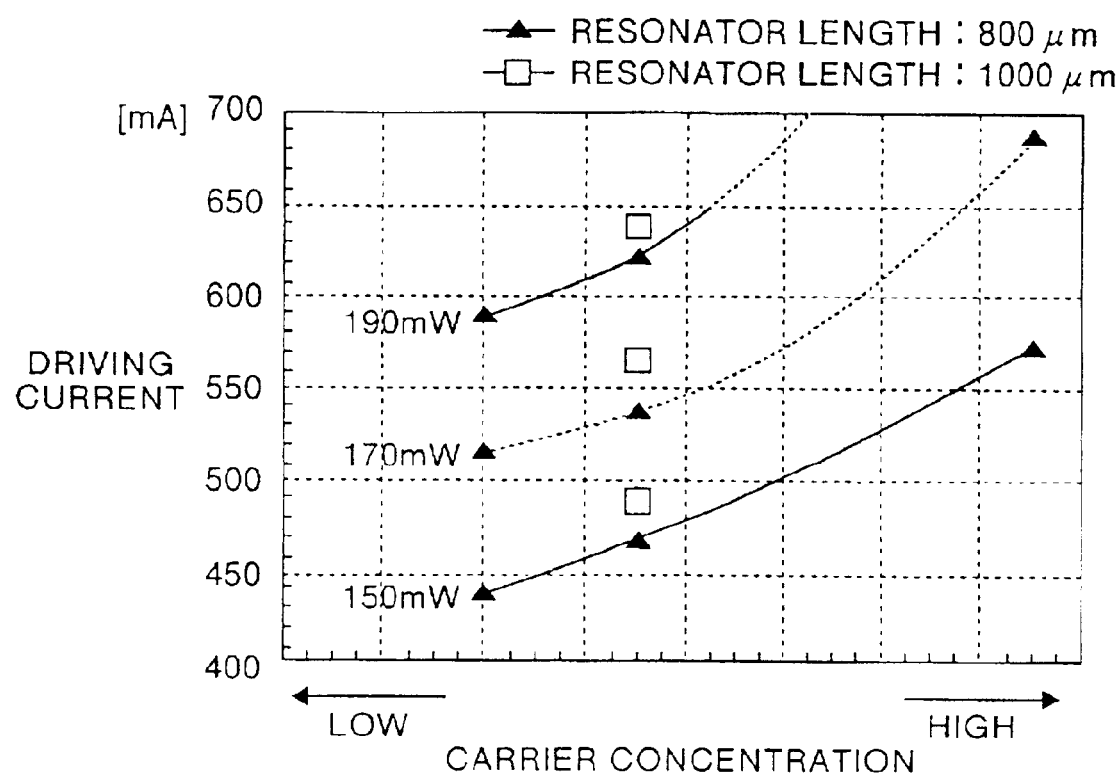
FIG. 15 is a graph showing a relationship of a driving current to a hole carrier concentration for optical output power to be constant as a parameter, as it has been employed for determination of the hole carrier concentration in an upper cladding layer of a conventional semiconductor laser apparatus.

FIG. 10 is a graph showing a relationship of electric drive power to a hole carrier concentration in the upper cladding layer for specified optical output power and specified cavity length taken as parameters. In FIG. 10, for a respective combination of a specified cavity length of 800 μm or 1000 μm and a specified optical output power such as 150 mW, 170 mW, or 190 mW, there is a corresponding hole carrier concentration in the upper cladding layer for the drive power to be minimal. Incidentally, as shown in FIG. 15, if a relationship is determined between an driving current and the hole carrier concentration in the upper cladding layer for a specified optical output power and a specified cavity length as parameters, the relationship has a monotonically increasing driving current, as the hole carrier concentration becomes higher, giving no optimum value. In other words, the hole carrier concentration has a minimum value, from view point of drive power.

It therefore is allowed to determine a hole carrier concentration in the upper cladding layer that minimizes the driving current relative to a desirable optical output power and a specified cavity length. With cavity length the more optimized, the more the driving current can be reduced, like the first to third embodiments.

For example, if the desirable optical output power is 190 mW and the cavity length is 800 μm, then the hole carrier concentration in the upper cladding layer takes a value Cz to have minimal drive power, that is 1.2 W. This driving current becomes 1.1 W, by setting the cavity length to 1000 μm.

Figure 11:
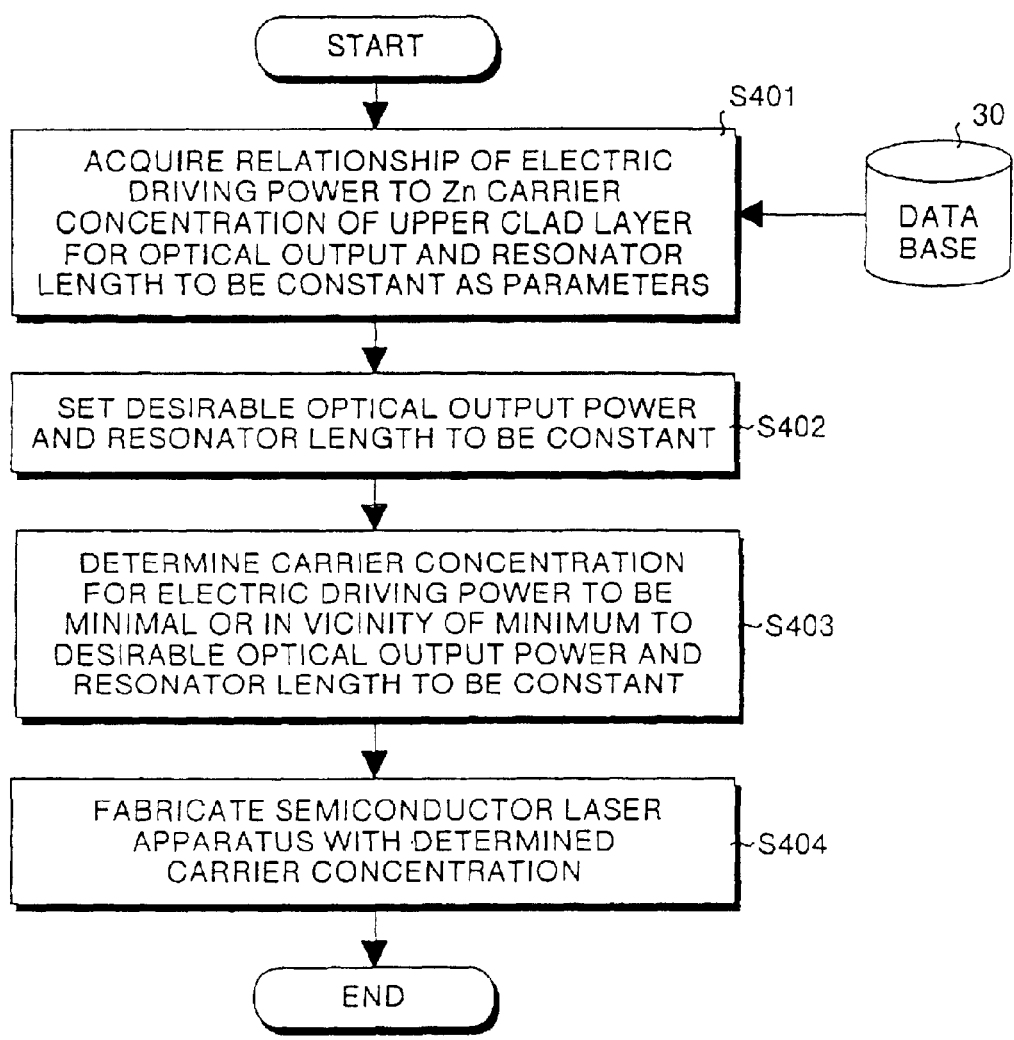
FIG. 11 is a flowchart showing a fabrication method of a semiconductor laser apparatus configured on the basis of the relationship shown in FIG. 10.

Referring now to the flowchart of FIG. 11, description is made of a fabrication method for a semiconductor laser apparatus according to the fourth embodiment. In FIG. 11, there is first acquired from a data base 30 a relationship of electric drive power to hole carrier concentration in the upper cladding layer for a specified optical output power and a specified cavity length as parameters (step S401), that is, the relationship shown in FIG. 10. Thereafter, a desirable optical output power and a specified cavity length are set (step S402), and a hole carrier concentration having drive power as a minimal or in a vicinity of a minimum is determined in correspondence to the set desirable optical output power and specified cavity length (step S403). Thereafter, a semiconductor laser apparatus that has the determined hole carrier concentration is fabricated (step S404), before the process ends.

The relationship between optical output power and hole carrier concentration for minimal drive power shown in FIG. 8 may be based on to obtain an approximation expression representing a relationship between hole carrier concentration and combination of optical output power and cavity length, to thereby determine a carrier concentration depending on this approximation expression. In the approximation expression, obtained minimal values are associated by a predetermined approximation expression. The approximation expression represents a relationship between an optimal hole carrier concentration and combination of optical output power and cavity length, and allows for an optimal hole carrier concentration to be directly determined by substituting a desirable value for optical output power and a specified value for cavity length.

Although, in the fourth embodiment, there is determined an optimal hole concentration due to Zn doping based on a relationship of drive power to hole carrier concentration, there may be determined, without limiting thereto and like the second embodiment, a relationship of photoelectric conversion efficiency to hole carrier concentration for specified optical output power and specified cavity length as parameters, to thereby determine a hole carrier concentration that maximizes the photoelectric conversion efficiency.

Further, although, in the fourth embodiment, there is determined a hole carrier concentration to render drive power minimal, there may be determined, without limiting thereto, a hole carrier concentration for drive power to be lower than specified, or a hole carrier concentration for drive power to be in a vicinity of a minimum. The vicinity of the minimum may cover hole carrier concentrations within a range specified by a given percentage that corresponds to drive power of the minimum value, or hole carrier concentrations within a range specified by a given percentage relative to a reference as a hole carrier concentration corresponding to drive power of the maximum value. There may be provided a specified margin for a hole carrier concentration determined by the approximation expression, as the margin corresponds to a range of the vicinity of minimum.

Although, in the foregoing first to fourth embodiments, the cavity length or hole carrier concentration in an upper cladding layer of semiconductor laser apparatus 20 is determined to render the drive power minimal or vicinal to a minimum or the photoelectric conversion efficiency maximal or vicinal to a maximum, there may be likewise determined, without limiting thereto, respective elements of the semiconductor laser apparatus 20. For example, there may be determined a value of reflection factor of the reflective film 14 or projection side reflective film 15 of the semiconductor laser apparatus 20.

Fifth Embodiment

Next, description is made a fifth embodiment of the invention. In the fifth embodiment, a semiconductor laser apparatus according to any of the first to fourth embodiments is made as a module.

Figure 12:
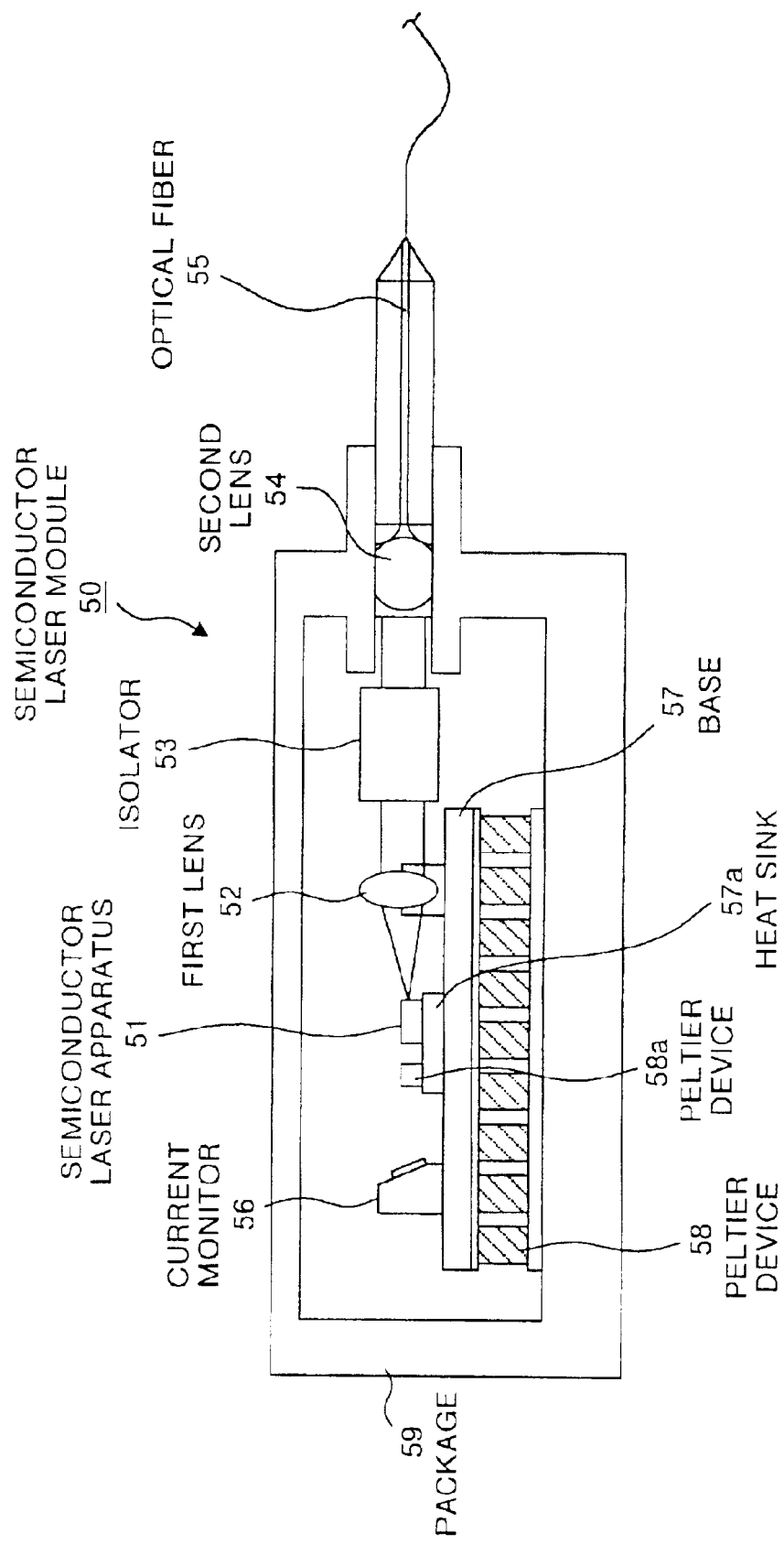
FIG. 12 is an illustration showing a semiconductor laser module according to a fifth embodiment of the invention.

FIG. 12 is a longitudinal sectional view showing an arrangement of a semiconductor laser module according to the fifth embodiment. In FIG. 12, this semiconductor laser module 50 has a semiconductor laser module 51 corresponding to any of the semiconductor laser modules in the first to fourth embodiments. On an inner bottom of a package 59 formed by a ceramic or the like as a housing of the semiconductor laser module 50, there is disposed a Peltier device 58 as a temperature controller. The Peltier device 58 has a base 57 disposed thereon, and a heat sink 57a disposed on the base 57a.

On the base 57 is disposed the semiconductor laser apparatus 51, as well as the heat sink 57a provided with a thermistor 58a, a first lens 52, and an electric current monitor 56. Laser light projected from the semiconductor laser apparatus 51 is conducted via the first lens 52, an isolator 53, and a second lens 54, to an optical fiber 55. The second lens 54 is installed on an optical axis of the laser light, on the package 59, to be optically coupled with the optical fiber 55 for external connection. The electric current monitor 56 monitors (i.e., detects for) leaked light at the reflection film end of the semiconductor laser apparatus 51.

The isolator 53 is interposed between the semiconductor laser apparatus 52 and the optical fiber 55, to prevent reflection return light, such as from other optics, from re-entering the cavity.

Figure 13:
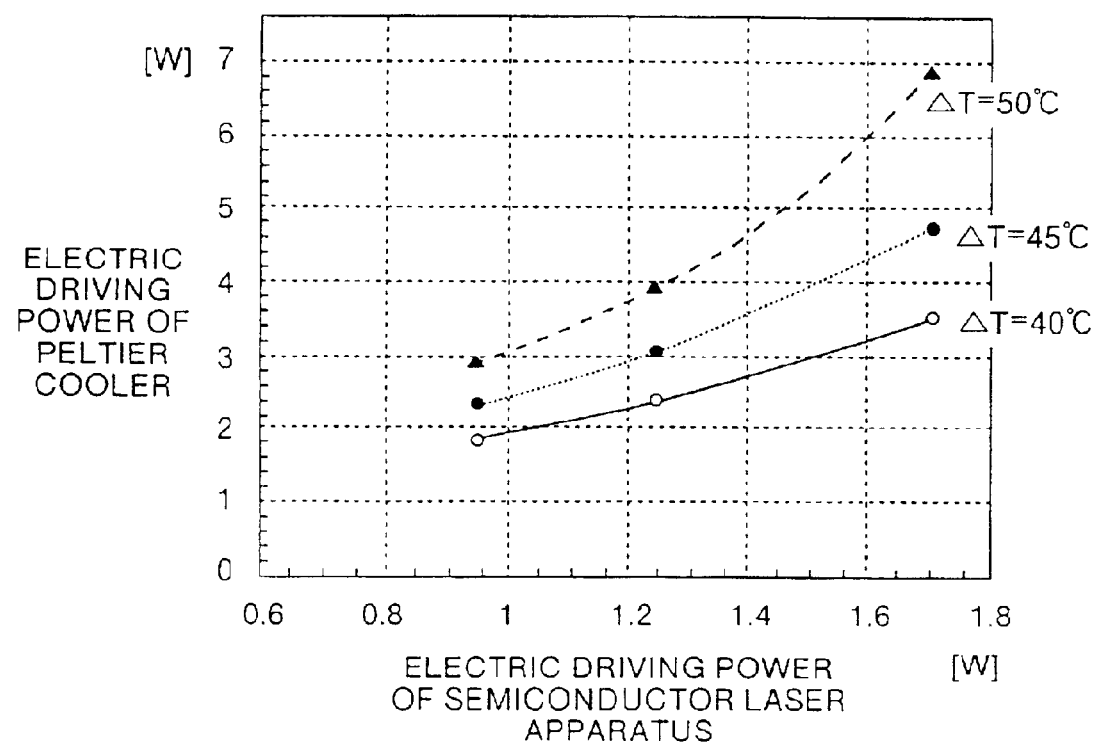
FIG. 13 is a graph showing a relationship between electric drive power of a semiconductor laser apparatus and electric drive power of a Peltier device in the case a temperature difference between a temperature of the semiconductor laser apparatus and an ambient temperature is taken as a parameter.

FIG. 13 is a graph showing a relationship between electric drive power of the semiconductor laser apparatus 51 and electric drive power of the Peltier device 58 in the case a temperature difference between a temperature of the semiconductor laser apparatus 51 and an ambient temperature is taken as a parameter. The drive power supplied to the Peltier device 58 is varied in dependence on the temperature difference ΔT between the temperature of the semiconductor laser apparatus 51 and the ambient temperature. As shown in FIG. 13, the larger the temperature difference ΔT becomes, the greater the drive power to be applied to the Peltier device 58 becomes. For example, for the semiconductor laser apparatus 51 to be kept at a temperature of 25° C. against an ambient temperature of 75° C., it is necessary to set the temperature difference ΔT to 50° C. In this case, if the drive power of the semiconductor laser apparatus 20 is 1.7 W, then the drive power to be applied to the Peltier device 58 is 7 W.

In this respect, by applying the semiconductor laser apparatus 20 of any of the first to fourth embodiments to the semiconductor laser module 50, the drive power to be applied to the Peltier device 58 can be reduced, as the drive power of the semiconductor laser device 20 is made small. For example, in the case the temperature difference ΔT to be kept is 50° C., if the drive power of the semiconductor laser device 20 is reduced from 1.7 W to 1.25 W, then the drive power to be applied to the Peltier device 58 decreases from 7 W to 4 W, thus achieving a reduction of power consumption by an amount of 3 W in addition to a power consumption reduction at the semiconductor laser apparatus 20. Like this, promotion of power consumption reduction of the semiconductor laser apparatus 20 itself leads to a reduction in the power consumption reduction of the entire semiconductor laser module 50.

Although, in the fifth embodiment, the semiconductor laser module is of a type in which laser light output from the semiconductor laser apparatus 20 is directly output, the invention may well be applied to a semiconductor laser module having an optical fiber grating of such a type that an optical fiber grating is formed in a vicinity of a second lens 54 side end of the optical fiber 55, and laser light output from the semiconductor laser apparatus 51 is output after a wavelength selection by the optical fiber grating.

In the fifth embodiment, a semiconductor laser apparatus according to any of the first to fourth embodiments is made as a module having a reduced power consumption, in particular at the Peltier device 58, with a resultant reduction of the total drive power of the entire semiconductor laser module 50, allowing for an enhanced photoelectric conversion efficiency.

As explained above, according to the first aspect of the invention, by implementation of a semiconductor laser apparatus wherein a respective element value of the semiconductor laser apparatus is determined on the basis of relationships between respective elements of the semiconductor laser apparatus including a cavity length of the semiconductor laser apparatus and a carrier concentration of an upper cladding layer of the semiconductor laser apparatus and a photoelectric conversion efficiency or an electric drive power of the semiconductor laser apparatus, for optical output power to be constant as a parameter, so that the electric drive power is vicinal to a minimum thereof or the photoelectric conversion efficiency is vicinal to a maximum thereof in correspondence to a desirable optical output power, it is enabled to obtain an desirable optical output power in a range over 50 mW, with a photoelectric conversion efficiency in a vicinity of a maximum or an electric drive power in a vicinity of a minimum. Consequently, a semiconductor laser apparatus that is capable of obtaining a desirable optical output power either at the electric drive power is vicinal to a minimum or the electric drive power is vicinal to a maximum is achieved easily. Further, As the photoelectric conversion efficiency becomes vicinal to a maximum, a reactive power is restrained, and temperature increase of the active layer of the semiconductor laser apparatus is restrained, thus the dependability of the semiconductor laser apparatus is improved.

According to the second aspect of the invention, by implementation of a semiconductor laser apparatus wherein a cavity length over 1000 μm is determined on the basis of a relationship of an electric drive power to a range of optical output power over 50 mW, for cavity length to be constant as a parameter in a range over 1000 μm, so that the electric drive power is vicinal to a minimum thereof in correspondence to a desirable optical output power, it is enabled to obtain an desirable optical output power in a range over 50 mW, with an electric drive power in a vicinity of a minimum. Consequently, a semiconductor laser apparatus that is capable of obtaining a desirable optical output power at the electric drive power is vicinal to a minimum is achieved easily. Further, As the drive power becomes vicinal to a minimum, a reactive power is restrained, and temperature increase of the active layer of the semiconductor laser apparatus is restrained, thus the dependability of the semiconductor laser apparatus is improved.

According to the third aspect of the invention, by implementation of a semiconductor laser apparatus wherein a cavity length is determined on the basis of a relationship of a photoelectric conversion efficiency to a range of cavity length over 1000 μm, for optical output power to be constant as a parameter in a range over 50 mW, so that the photoelectric conversion efficiency is vicinal to a maximum thereof in correspondence to a desirable optical output power. Consequently, it is enabled to easily obtain a semiconductor laser apparatus with a desirable optical output power with high photoelectric conversion efficiency.

According to the fourth aspect of the invention, determination of the cavity length is based an approximation expression making the photoelectric conversion efficiency maximal in correspondence to the desirable optical output power. Consequently, with using computers, it is enabled to quickly determine a cavity length of a semiconductor laser apparatus by a desirable optical output power with high photoelectric conversion efficiency.

According to the fifth aspect of the invention, by implementation of a semiconductor laser apparatus having a cavity length over 1000 μm determined on the basis of a relationship of an electric drive power to a range of cavity length over 1000 μm, for optical output power to be constant as a parameter in a range over 50 mW, so that the electric drive power is vicinal to a minimum thereof in correspondence to a desirable optical output power, it is enabled to obtain an desirable optical output power in a range over 50 mW, with a low electric drive power. Consequently, it is enabled to easily obtain a semiconductor laser apparatus with a desirable optical output power with a low drive power.

According to the sixth aspect of the invention, when the cavity length is determined, it is determined on the basis of an approximation expression making an electric drive power minimal in correspondence to the desirable optical output power. Consequently, with using computer programs or the like, it is enabled to quickly determine a cavity length of a cavity length of a semiconductor laser apparatus by a desirable optical output power with a low drive power.

According to the seventh aspect of the invention, as an active layer forming a cavity with the cavity length, there is applied a strain multiple quantum well structure, while it is enabled even for the semiconductor laser apparatus having a strain multiple quantum well structure to obtain an desirable optical output power in a range over 50 mW, with high photoelectric conversion efficiency or a low electric drive power. Consequently, it is enabled to obtain a high flexibility that can be applied to a semiconductor laser apparatus having various structures.

According to the eighth aspect of the invention, there is implemented a concrete semiconductor laser apparatus to be distinctive, particularly when letting the desirable optical output power be within a range of 50 mW to 400 mW and the cavity length be within a range of 1000 μm to 1600 μm, and determining the cavity length simply from the relationship of the electric drive power to the optical output power. Consequently, it is enabled to obtain a desirable optical output power with a high photoelectric power conversion efficiency or a low electric drive power.

According to the ninth aspect of the invention, there is implemented a concrete semiconductor laser apparatus to be distinctive, particularly when letting the desirable optical output power be within a range of 50 mW to 200 mW and the cavity length be within a range of 1000 μm to 1400 μm, and determining the cavity length simply from the relationship of the electric drive power to the optical output power. Consequently, it is enabled to obtain a desirable optical output power with a high photoelectric power conversion efficiency or low electric drive power.

According to the tenth aspect of the invention, by implementation of a semiconductor laser apparatus, an upper cladding layer has an impurity carrier concentration determined on the basis of a relationship of a photoelectric conversion efficiency or an electric drive power to the impurity carrier concentration of the upper cladding layer, for optical output power and cavity length to be constant as parameters, so that the electric drive power is vicinal to a minimum thereof or the photoelectric conversion efficiency is vicinal to a maximum thereof in correspondence to a desirable optical output power, it is enabled to obtain an desirable optical output power in a range over 50 mW, with a photoelectric conversion efficiency in a vicinity of a maximum or an electric drive power in a vicinity of a minimum. Consequently, it is enabled to easily obtain a semiconductor laser apparatus that is capable of obtaining a desirable optical output power at the electric drive power is vicinal to a minimum and the photoelectric conversion efficiency is vicinal to a maximum.

According to the eleventh aspect of the invention, by implementation of a semiconductor laser module with an incorporated semiconductor laser apparatus according to any of the first to tenth aspects of the invention, it is enabled to achieve an desirable optical output power, with high photoelectric conversion efficiency or a low electric drive power. Consequently, with the semiconductor laser module on the whole, it is enabled to obtain a desirable optical output power with a high photoelectric power conversion efficiency or a low electric drive power.

According to the twelfth aspect of the invention, an optical fiber grating is formed in a vicinity of an incidence end of the optical fiber, and laser light of a wavelength selected by the optical fiber grating is output. Consequently, even with the semiconductor laser module to achieve the semiconductor laser apparatus using an optical fiber grating, it is enabled to obtain a desirable optical output power with a high photoelectric power conversion efficiency or a low electric drive power.

According to the thirteenth aspect of the invention, by implementation of a semiconductor laser module with an incorporated semiconductor laser apparatus according to any of the first to tenth aspects of the invention, it is enabled even for the semiconductor laser module with an incorporated temperature controller to obtain an desirable optical output power, with high photoelectric conversion efficiency or a low electric drive power. Consequently, with the semiconductor laser module on the whole, it is enabled to obtain a desirable optical output power with a high photoelectric power conversion efficiency or a low electric drive power.

According to the fourteenth aspect of the invention, for fabrication of a semiconductor laser apparatus, in a relationship acquiring step there are acquired relationships between respective elements of the semiconductor laser apparatus including a cavity length of the semiconductor laser apparatus and a carrier concentration of an upper cladding layer of the semiconductor laser apparatus and a photoelectric conversion efficiency or an electric drive power of the semiconductor laser apparatus, for optical output power to be constant as a parameter, in an element value determining step there is determined a respective element value of the semiconductor laser apparatus to be determined on the basis of the relationships acquired by the relationship acquiring step, so that the electric drive power is vicinal to a minimum thereof or the photoelectric conversion efficiency is vicinal to a maximum thereof in correspondence to a desirable optical output power, and in a forming step there is formed the semiconductor laser apparatus having the respective element value determined by the element value determining step. Consequently, it is enabled to easily manufacture a semiconductor laser apparatus that is capable of obtaining a desirable optical output power at the electric drive power is vicinal to a minimum and the photoelectric conversion efficiency is vicinal to a maximum.

According to the fifteenth aspect of the invention, for fabrication of a semiconductor laser apparatus, in a relationship acquiring step there is acquired a relationship of an electric drive power to a range of optical output power over 50 mW, for cavity length to be constant as a parameter in a range over 1000 μm, in a cavity length determining step there is determined a cavity length over 1000 μm to be determined on the basis of the relationship acquired by the relationship acquiring step, so that the electric drive power is vicinal to a minimum thereof in correspondence to a desirable optical output power, and in a forming step there is formed the semiconductor laser apparatus having the cavity length determined by the cavity length determining step. Consequently, it is enabled to easily obtain a semiconductor laser apparatus that is capable of obtaining a desirable optical output power at the electric drive power is vicinal to a minimum.

According to the sixteenth aspect of the invention, for fabrication of a semiconductor laser apparatus, in a relationship acquiring step there is acquired a relationship of a photoelectric conversion efficiency to a range of cavity length over 1000 μm, for optical output power to be constant as a parameter in a range over 50 mW, in a cavity length determining step there is determined a cavity length to be determined on the basis of the relationship acquired by the relationship acquiring step, so that the photoelectric conversion efficiency is vicinal to a maximum thereof in correspondence to a desirable optical output power, and in a forming step there is formed the semiconductor laser apparatus having the cavity length determined by the cavity length determining step. Consequently, it is enabled to easily obtain a semiconductor laser apparatus that is capable of obtaining a desirable optical output power with a high photoelectric conversion efficiency.

According to the seventeenth aspect of the invention, an approximation expression calculating step determines an approximation expression for making the photoelectric conversion efficiency maximal in correspondence to the desirable optical output power, on the basis of the relationship acquired by the relationship acquiring step, and the cavity length determining step determines the cavity length on the basis of the approximation expression. Consequently, with using computer programs or the like, it is enabled to quickly determine a cavity length of a cavity length of a semiconductor laser apparatus obtainable by a desirable optical output power with a high photoelectric conversion efficiency.

According to the eighteenth aspect of the invention, for fabrication of a semiconductor laser apparatus, in a relationship acquiring step there is acquired a relationship of an electric drive power to a range of cavity length over 1000 μm, for optical output power to be constant as a parameter in a range over 50 mW, in a cavity length determining step there is determined a cavity length over 1000 μm to be determined on the basis of the relationship acquired by the relationship acquiring step, so that the electric drive power is vicinal to a minimum thereof in correspondence to a desirable optical output power, and in a forming step there is formed the semiconductor laser apparatus having the cavity length determined by the cavity length determining step. Consequently, it is enabled to quickly determine a cavity length of a cavity length of a semiconductor laser apparatus with a desirable optical output power with a low drive power.

According to the nineteenth aspect of the invention, an approximation expression calculating step determines an approximation expression for making the electric drive power minimal in correspondence to the desirable optical output power, on the basis of the relationship acquired by the relationship acquiring step, and the cavity length determining step determines the cavity length on the basis of the approximation expression. Consequently, with using computer programs or the like, it is enabled to quickly determine a cavity length of a cavity length of a semiconductor laser apparatus obtainable by a desirable optical output power with a low drive power.

According to the twentieth aspect of the invention, as an active layer forming a cavity with the cavity length there is applied a strain multiple quantum well structure, while it is enabled even for the semiconductor laser apparatus having a strain multiple quantum well structure to obtain an desirable optical output power in a range over 50 mW, with high photoelectric conversion efficiency or a low electric drive power. Consequently, it is enabled to obtain a high flexibility that can be applied to a semiconductor laser apparatus having various structures.

According to the twenty-first aspect of the invention, for fabrication of a semiconductor laser apparatus, in a relationship acquiring step there is acquired a relationship of an electric drive power to an impurity carrier concentration of an upper cladding layer, for optical output power and cavity length to be constant as parameters, in a carrier concentration determining step there is determined the impurity carrier concentration to be determined on the basis of the relationship acquired by the relationship acquiring step, so that the electric drive power is vicinal to a minimum thereof in correspondence to a desirable optical output power, and in a forming step there is formed the semiconductor laser apparatus with the upper cladding layer having the impurity carrier concentration thereof set to the impurity carrier concentration determined by the carrier concentration determining step. Consequently, it is enabled to easily obtain a semiconductor laser apparatus that is capable of obtaining a desirable optical output power at the electric drive power is vicinal to a minimum and the photoelectric conversion efficiency is vicinal to a maximum.

Having thus generally described the aspects of the present invention, we now describe the results of the application of the present invention to the specific area of Group III-V semiconductor lasers having the following general features:

A resonator cavity having a front facet, a back facet, and a length L between facets in the range of approximately 1000 μm to approximately 1800 μm, an active layer disposed within the resonator cavity and being electrically coupled to two electrodes for receiving an electrical bias potential, a low reflectance coating disposed on the front facet having a reflectivity of less than approximately 4%, a high reflectance coating disposed on the back facet and having a reflectivity of more than approximately 80%, and a hole carrier concentration in the upper cladding layer above the active layer, with a value in the range of $4 \times 10^{17}$ cm$^{-3}$ to $1 \times 10^{18}$ cm$^{-3}$ (with $7 \times 10^{17}$ cm$^{-3}$ being exemplary), preferably provided by Zn (zinc) doping.

Group III-V semiconductors comprise one or more of the following compounds formed as layer structures: GaAs, InGaAs, AlGaAs, InGaAsP, InP.

FIG. 16 shows the ranges of cavity length L of this category of semiconductor lasers which results in an input electrical drive power that is within approximately 5% to approximately 10% of the minimum drive power for a given value of optical output power $P_{OUT}$ in the range between 50 mW and 390 mW, and/or which results in a photoelectric conversion efficiency that is within approximately 5% to approximately 10% of the maximum conversion efficiency for the given value Of $P_{OUT}$. (The region of cavity length less than 1000 μm was omitted in order to satisfy the requirement from the maximum rating.) The exterior vertices of the area of ranges is defined by the following 12 points P1–P12, which are shown in FIG. 16 and have the following values:

TABLE I

| Point | Length Value | Power value |
|---|---|---|
| P1 | 1380 μm | 50 mW |
| P2 | 1480 μm | 100 mW |
| P3 | 1700 μm | 200 mW |
| P4 | 1750 μm | 300 mW |
| P5 | 1750 μm | 360 mW |
| P6 | 1770 μm | 390 mW |
| P7 | 1450 μm | 390 mW |
| P8 | 1350 μm | 360 mW |
| P9 | 1200 μm | 300 mW |
| P10 | 1050 μm | 200 mW |
| P11 | 1000 μm | 100 mW |
| P12 | 1000 μm | 50 mW |

A plurality of line segments 540–551 connect points P1–P12 and define the outer edges of the range area. Line segments 547–551 define the lower bounds (left side) of cavity lengths, and line segments 541–545 define the upper bounds (right side) of cavity lengths. FIG. 16 may also be viewed as providing preferred operating ranges for the optical output power for a given cavity length of the laser. In this case, segment 540–545 define the lower bounds (bottom side) of optical output powers, and segments 546–551 define the upper bounds (top side) of the optical output powers.

The line segments 540–551 shown in FIG. 16 may be mathematically defined by the following sets of equations, each capable of being defined as a function of cavity length L or as a function of output power $P_{OUT}$:

Line Segment 540

Span over L: 1000 μm to 1380 μm
  Span over $P_{OUT}$: 50 mW to 50 mW
  L = [1000 μm, 1380 μm]                                    (1A)
  $P_{OUT}$ = 50 mW                                         (1B)

Line Segment 541

Span over L: 1380 μm to 1480 μm
  Span over $P_{OUT}$: 50 mW to 100 mW
  L = (100 μm/50 mW)*$P_{OUT}$ + 1280 μm                    (2A)
    = 2 μm*($P_{OUT}$/1 mW) + 1280 μm                       (2B)
  $P_{OUT}$ = (1 mW)*[(L−1280 μm)/2 μm]                     (2C)

Line Segment 542

Span over L: 1480 μm to 1700 μm
  Span over $P_{OUT}$: 100 mW to 200 mW
  L = (220 μm/100 mW)*$P_{OUT}$ + 1260 μm                   (3A)
    = 2.2 μm*($P_{OUT}$/1 mW) + 1260 μm                     (3B)
  $P_{OUT}$ = (1 mW)*[(L−1260 μm)/2.2 μm]                   (3C)

Line Segment 543

Span over L: 1700 μm to 1750 μm
  Span over $P_{OUT}$: 200 mW to 300 mW
  L = (50 μm/100 mW)*$P_{OUT}$ + 1600 μm                    (4A)
    = 1 μm*($P_{OUT}$/2 mW) + 1600 μm                       (4B)
  $P_{OUT}$ = (2 mW)*[(L−1600 μm)/1 μm]                     (4C)

Line Segment 544

Span over L: 1750 μm to 1750 μm
  Span over $P_{OUT}$: 300 mW to 360 mW
  L = 1750 μm                                                (5A)
  $P_{OUT}$ = [300 mW, 360 mW]                              (5B)

Line Segment 545

Span over L: 1750 μm to 1770 μm
  Span over $P_{OUT}$: 360 mW to 390 mW
  L = (20 μm/30 mW)*$P_{OUT}$ + 1510 μm                     (6A)
    = 2 μm*($P_{OUT}$/3 mW) + 1510 μm                       (6B)
  $P_{OUT}$ = (3 mW)*[(L−1510 μm)/2 μm]                     (6C)

Line Segment 546

Span over L: 1450 μm to 1770 μm
  Span over $P_{OUT}$: 390 mW to 390 mW
  L = [1450 μm, 1770 μm]                                    (7A)
  $P_{OUT}$ = 390 mW                                        (7B)

Line Segment 547

Span over L: 1350 μm to 1450 μm
  Span over $P_{OUT}$: 360 mW to 390 mW
  L = (100 μm/30 mW)*$P_{OUT}$ + 150 μm                     (8A)
    = 10 μm*($P_{OUT}$/3 mW) + 150 μm                       (8B)
  $P_{OUT}$ = (3 mW)*[(L−150 μm)/10 μm]                     (8C)

Line Segment 548

Span over L: 1200 μm to 1350 μm
  Span over $P_{OUT}$: 300 mW to 360 mW
  L = (150 μm/60 mW)*$P_{OUT}$ + 450 μm                     (9A)
    = 5 μm*($P_{OUT}$/2 mW) + 450 μm                        (9B)
  $P_{OUT}$ = (2 mW)*[(L−450 μm)/5 μm]                      (9C)

Line Segment 549

Span over L: 1050 μm to 1200 μm
  Span over $P_{OUT}$: 200 mW to 300 mW
  L = (150 μm/100 mW)*$P_{OUT}$ + 750 μm                    (10A)
    = 3 μm*($P_{OUT}$/2 mW) + 750 μm                        (10B)
  $P_{OUT}$ = (2 mW)*[(L−750 μm)/3 μm]                      (10C)

Line Segment 550

Span over L: 1000 μm to 1050 μm
  Span over $P_{OUT}$: 100 mW to 200 mW
  L = (50 μm/100 mW)*$P_{OUT}$ + 950 μm                     (11A)
    = 1 μm*($P_{OUT}$/2 mW) + 950 μm                        (11B)
  $P_{OUT}$ = (2 mW)*[(L−950 μm)/1 μm]                      (11C)

Line Segment 551

Span over L: 1000 μm to 1000 μm
  Span over $P_{OUT}$: 50 mW to 100 mW
  L = 1000 μm                                                (12A)
  $P_{OUT}$ = [50 mW, 100 mW]                               (12B)

The ranges encompass the six measurement data sets shown in FIGS. 6 and 8 taken at output powers $P_{OUT}$ of 50 mW, 100 mW, 200 mW, 300 mW, 360 mW, and 390 mW, which are indicated in FIG. 16 as lines 501–506.

With lines segments 540–551, the span of desired cavity length L may be divided into the nine ranges indicated in Table II, where "~" means "approximately." The values of $P_{OUT}$ within these ranges are bounded by the line and data segments indicated in Table II.

TABLE II

| L Range | Line Segment Lower Bound For $P_{OUT}$ | Line Segment Upper Bound For $P_{OUT}$ |
|---|---|---|
| ~1000 μm to ~1050 μm | Line Segment 540 (equation 1B, 50 mW) | Line Segment 550 (equation 11C) |
| ~1050 μm to ~1200 μm | Line Segment 540 (equation 1B, 50 mW) | Line Segment 549 (equation 10C) |
| ~1200 μm to ~1350 μm | Line Segment 540 (equation 1B, 50 mW) | Line Segment 548 (equation 9C) |
| ~1350 μm to ~1380 μm | Line Segment 540 (equation 1B, 50 mW) | Line Segment 547 (equation 8C) |
| ~1380 μm to ~1450 μm | Line Segment 541 (equation 2C) | Line Segment 547 (equation 8C) |
| ~1450 μm to ~1480 μm | Line Segment 541 (equation 2C) | Line Segment 546 (equation 7B, 390 mW) |
| ~1480 μm to ~1700 μm | Line Segment 542 (equation 3C) | Line Segment 546 (equation 7B, 390 mW) |
| ~1700 μm to ~1750 μm | Line Segment 543 (equation 4C) | Line Segment 546 (equation 7B, 390 mW) |
| ~1750 μm to ~1770 μm | Line Segment 545 (equation 6C) | Line Segment 546 (equation 7B, 390 mW) |

Given a laser with a specific length, one may locate the corresponding range for the given length, and then operate the laser at a power level that is at or between the lower and upper bounds specified for the length's range. Such operation can be readily achieved with a power supply (see FIG. 1) which is coupled to the laser's power electrodes and which is configured to apply an amount of power which causes the semiconductor laser to operate with the selected optical output power. The present invention encompasses a laser device operated in this manner, as well as a method of operating a laser in this manner by selecting an operating optical output power based on the laser's length in accordance with FIG. 16 and Table II.

In a similar manner, the span of optical output power $P_{OUT}$ may be divided into five ranges, as provided in Table III. The values of cavity length L within these ranges are bounded by the line and data segments indicated in Table II.

TABLE III

| $P_{OUT}$ Range | Lower Bound For L | Upper Bound For L |
|---|---|---|
| ~50 mW to ~400 mW | Line Segment 551 (equation 12A, L = 1000 μm) | Line Segment 541 (equation 2A or 2B) |
| ~100 mW to ~200 mW | Line Segment 550 | Line Segment 542 |

TABLE III-continued

| P_OUT Range | Lower Bound For L | Upper Bound For L |
|---|---|---|
| | (equation 11A or 11B) | (equation 3A or 3B) |
| ~200 mW to ~300 mW | Line Segment 549 | Line Segment 543 |
| | (equation 10A or 10B) | (equation 4A or 4B) |
| ~300 mW to ~360 mW | Line Segment 548 | Line Segment 544 |
| | (equation 9A or 9B) | (equation 5A, L = 1750 μm) |
| ~360 mW to ~390 mW | Line Segment 547 | Line Segment 545 |
| | (equation 8A or 8B) | (equation 6A or 6B) |

Given a specific optical output power level for a laser, one may locate the corresponding range for the specified power level, and then select a length for the laser which is at or between the lower and upper bounds specified for the power level's range. Such selection of length can be achieved by cleaving facets of the laser chip at locations which achieve the desire length. The present invention accordingly further encompasses a method of selecting the cavity length of a semiconductor laser depending upon the desire optical power level in this manner, as based upon FIG. 16 and Table III.

As described above, one may consult Table II and choose an operating power level based upon a given cavity length. While being more complex, one may also perform such a selection process based on Table III, in which case one examines the second and third columns to find one or more optical output power ranges which include the given cavity length. From the ranges found, one can then select corresponding ranges of output power levels for the given cavity length.

It may be appreciated that the above method and laser embodiments of the present invention may be practiced using just one of the ranges provided in Tables II and III, or using a combination of two or more of the ranges in these tables.

The above method and laser embodiments of the present invention may also be practiced within the following three preferred zones of FIG. 16:

1. Cavity lengths in the range of approximately 1000 μm to approximately 1100 μm, with the laser to operated, or desired to be operated, at an optical output power $P_{OUT}$ of between approximately 50 mW and approximately 100 mW.
2. Cavity lengths in the range of approximately 1200 μm to approximately 1600 μm, with the laser to operated, or desired to be operated, at an optical output power $P_{OUT}$ of between approximately 200 mW and approximately 300 mW.
3. Cavity lengths in the range of approximately 1300 μm to approximately 1800 μm, with the laser to operated, or desired to be operated, at an optical output power $P_{OUT}$ of between approximately 350 mW and approximately 400 mW.

Although the invention has been described with respect to specific embodiments for a complete and clear disclosure, the appended claims are not to be thus limited but are to be construed as embodying all modifications and alternative constructions that may occur to one skilled in the art which fairly fall within the basic teaching herein set forth.

What is claimed is:

1. A fabrication method for a semiconductor laser apparatus to be operated at a desired optical output power level from a source of electric drive power, the desired optical output power level being greater than 50 mW, the semiconductor laser apparatus having a semiconductor laminated structure formed on a substrate, the laminated structure including a lower cladding layer, an upper cladding layer, an active layer disposed between the lower and upper cladding layers, a front facet to output the laser beam, a back facet, and a cavity length between the front and back facets, the active layer being configured to generate light such that the apparatus provides optical output power at the front facet in response to the source of electric drive power, the fabrication method comprising:

acquiring a relationship of the electric drive power as a function of the cavity length and the optical output power level of the semiconductor laser apparatus, the relationship including cavity lengths greater than 1000 μm and optical output power levels greater than 50 mW;

determining a value of the cavity length from the acquired relationship such that the electric drive power is vicinal to a minimum for the desired optical output power level and such that the value of cavity length is greater than 1000 μm, the desired optical power level being greater than 50 mW;

forming a semiconductor laminated structure on a substrate, the step including the steps of forming a lower cladding layer over the substrate, forming an active layer over the lower cladding layer, and forming an inner cladding layer over the active layer; and forming the semiconductor laser apparatus from the semiconductor laminated structure such that it has a front facet, a back facet, and a cavity length between said facets, the cavity length having the value of the cavity length determined by the cavity length determining step.

2. A fabrication method for a semiconductor laser apparatus according to claim 1, wherein an active layer fanning a cavity with the cavity length has a strain multiple quantum well structure.

3. A fabrication method for a semiconductor laser apparatus to be operated at a desired optical output power level from a source of electric drive power, the desired optical output power level being greater than 50 mW, the semiconductor laser apparatus having a semiconductor laminated structure formed on a substrate, the laminated, structure including a lower cladding layer, an upper cladding layer, an active layer disposed between the lower and upper cladding layers, a front facet to output the laser beam, a back facet, and a cavity length between the front and back facets, the active layer being configured to generate light such that the apparatus provides optical output power at the front facet in response to the source of electric drive power, the apparatus having a photoelectric conversion efficiency defined as the ratio of the optical output power to the electric drive power, the fabrication method comprising:

(a) acquiring a relationship of the photoelectric conversion efficiency as a function of the cavity length and the optical output power level of the semiconductor laser apparatus, the relationship including cavity lengths greater than 1000 μm and optical output power levels greater than 50 mW;

(b) determining a value of the cavity length from the acquired relationship such that the photoelectric conversion efficiency is vicinal to a maximum for the desired optical output power level and such that the value of the cavity length is greater than 1000 μm, the desired optical power level being greater than 50 mW;

c) forming a semiconductor laminated structure on a substrate, the step including the steps of forming a lower cladding layer over the substrate, forming an active layer over the lower cladding layer, and forming an upper cladding layer over the active layer; and d) forming the semiconductor laser apparatus from the semiconductor laminated structure such that it has a front facet, a back facet, and a cavity length between said facets, the cavity length having the value of the cavity length determined by the cavity length determining step.

4. A fabrication method for a semiconductor laser apparatus according to claim 3, wherein step (b) comprises:

obtaining, from the relationship acquired from step (a), an expression between cavity length and optical output power which describes combinations of cavity lengths and optical output power levels that make the photoelectric conversion efficiency maximal; and determining the value of cavity length on the basis of the expression.

5. A fabrication method for a semiconductor laser apparatus according to claim 3, wherein an active layer forming a cavity with the cavity length has a strain multiple quantum well structure.

6. A fabrication method for a semiconductor laser apparatus to be operated at a desired optical output power level from a source of electric drive power, the semiconductor laser apparatus having a semiconductor laminated structure formed on a substrate, the laminated structure including a lower cladding layer, an upper cladding layer, an active layer disposed between the lower and upper cladding layers, a front facet to output the laser beam, a back facet, and a cavity length between the front and back facets, the upper cladding layer having an impurity carrier concentration, the active layer being configured to generate light such that the apparatus provides optical output power at the front facet in response to the source of electric drive power, the fabrication method comprising:

(a) acquiring a relationship of the electric drive power as a function of the impurity carrier concentration of the upper cladding layer and the optical output power level of the semiconductor laser apparatus;

(b) determining a value of the impurity carrier concentration from the acquired relationship such that the electric drive power is vicinal to a minimum for the desired optical output power level;

(c) forming a semiconductor laminated structure on a substrate, the step including the steps of forming a lower cladding layer over the substrate, forming an active layer over the lower cladding layer, and forming an upper cladding layer over the active layer with the upper cladding layer having the impurity carrier concentration set to the value determined by the carrier concentration determining step (b); and (d) forming the semiconductor laser apparatus from the semiconductor laminated structure such that it has a front facet, a back facet, and a cavity length between said facets.

7. A fabrication method for a semiconductor laser apparatus according to claim 6, wherein an active layer forming a cavity with the cavity length has a strain multiple quantum well structure.

8. A semiconductor laser comprising:

a semiconductor laminated structure having a substrate, a lower cladding layer, an upper cladding layer, an active layer disposed between the lower and upper cladding layers, a first electrode, a second electrode, a front facet to output the laser beam, a back facet, and a cavity length L between the front and back facets, the active layer being configured to generate light such that the apparatus provides optical output power at the front facet in response to a source of electrical power applied to the first and second electrodes, the cavity length L being in the range of approximately 1000 $\mu$m to approximately 1800 $\mu$m;

a low reflectance coating disposed on the front facet having a reflectivity of less than approximately 4%;

a high reflectance coating disposed on the back facet and having a reflectivity of more than approximately 80%;

a power supply coupled to said electrodes and applying an amount of power which causes the semiconductor laser to operate with an optical output power level $P_{OUT}$ that is maintained at or above 50 mW and within a range that is less than or equal to a specified upper bound and greater than or equal to a specified lower bound, the specified upper and lower bounds being based on the cavity length L, the specified lower bound having a value of 50 mW for cavity lengths between approximately 1000 $\mu$m and 1380 $\mu$m, a value equal to the quantity (1 mW)*[(L−1280 $\mu$m)/2 $\mu$m)] for cavity lengths of 1380 $\mu$m to 1480 $\mu$m, a value equal to the quantity (1 mW)*[(L−1260 $\mu$m)/2.2 $\mu$m)] for cavity lengths of 1480 $\mu$m to 1700 $\mu$m, a value equal to the quantity (2 mW)*[(L−1600 $\mu$m)/1 $\mu$m)] for cavity lengths of 1700 $\mu$m to 1750 $\mu$m, and a value of (3 mW)*[(L−1510 $\mu$m)/2 $\mu$m)] for cavity lengths of 1750 $\mu$m to approximately 1770 $\mu$m, and the specified upper bound having a value equal to the quantity (2 mW)*[(L−950 $\mu$m)/1 $\mu$m)] for cavity lengths of approximately 1000 $\mu$m to 1050 $\mu$m, a value equal to the quantity (2 mW)*[(L−750 $\mu$m)/3 $\mu$m)] for cavity lengths of 1050 $\mu$m to 1200 $\mu$m, a value equal to the quantity (2 mW)*[(L−450 $\mu$m)/5 $\mu$m)] for cavity lengths of 1200 $\mu$m to 1350 $\mu$m, a value equal to the quantity (3 mW)*[(L−150 $\mu$m)/10 $\mu$m)] for cavity lengths of 1350 $\mu$m to 1450 $\mu$m, and a value equal to the quantity 390 mW for cavity lengths of 1450 $\mu$m to approximately 1770 $\mu$m.

9. The semiconductor laser of claim 8 wherein the amount of electrical potential applied to said electrodes causes the semiconductor laser to operate at an optical output power level $P_{OUT}$ of between approximately 50 mW and approximately 100 mW, and wherein the cavity length is in the range between approximately 1000 $\mu$m and approximately {2$\mu$m*($P_{OUT}$/1 mW)+1280 $\mu$m}.

10. The semiconductor laser of claim 8 wherein the amount of electrical potential applied to said electrodes causes the semiconductor laser to operate at an optical output power level $P_{OUT}$ of between approximately 100 mW and approximately 200 mW, and wherein the cavity length is in the range between approximately {1 $\mu$m*($P_{OUT}$/2 mW)+950 $\mu$m} and approximately {2.2 $\mu$m*($P_{OUT}$/1 mW)+1260 $\mu$m }.

11. The semiconductor laser of claim 8 wherein the amount of electrical potential applied to said electrodes causes the semiconductor laser to operate at an optical output power level $P_{OUT}$ of between approximately 200 mW and approximately 300 mW, and wherein the cavity length is in the range between approximately {3 $\mu$m*($P_{OUT}$/2 mW)+750 $\mu$m} and approximately {1 $\mu$m*($P_{OUT}$/2 mW)+1600 $\mu$m}.

12. The semiconductor laser of claim 8 wherein the amount of electrical potential applied to said electrodes causes the semiconductor laser to operate at an optical output power level P$_{OUT}$ of between approximately 300 mW and approximately 360 mW, and wherein the cavity length is in the range between approximately approximately {5 μm*(P$_{OUT}$/2 mW)+450 μm} and approximately 1750 μm.

13. The semiconductor laser of claim 8 wherein the amount of electrical potential applied to said electrodes causes the semiconductor laser to operate at an optical output power level P$_{OUT}$ of between approximately 360 mW and approximately 390 mW, and wherein the cavity length is in the range between approximately {10 μm*(P$_{OUT}$/3 mW)+150 μm} and approximately {2 μm*(P$_{OUT}$/3 mW)+1510 μm}).

14. The semiconductor laser of claim 8 wherein the length L is in the range of approximately 1000 μm to approximately 1100 μm, and wherein an amount of electrical potential applied to said electrodes which causes the semiconductor laser to operate at an optical output power level P$_{OUT}$ of between approximately 50 mW and approximately 100 mW.

15. The semiconductor laser of claim 8 wherein the length L is in the range of approximately 1200 μm to approximately 1600 μm, and wherein an amount of electrical potential applied to said electrodes which causes the semiconductor laser to operate at an optical output power level P$_{OUT}$ of between approximately 200 mW and approximately 300 mW.

16. A semiconductor laser comprising:
a semiconductor laminated structure having a substrate, a lower cladding layer, an upper cladding layer, an active layer disposed between the lower and upper cladding layers, a first electrode, a second electrode, a front facet to output the laser beam, a back facet, and a cavity length L between the front and back facets, the active layer being configured to generate light such that the apparatus provides optical output power at the front facet in response to a source of electrical power applied to the first and second electrodes, the cavity, length L being in the range of approximately 1000 μm to approximately 1800 μm;
a low reflectance coating disposed on the front facet having a reflectivity of less than approximately 4%;
a high reflectance coating disposed on the back facet and having a reflectivity of more than approximately 80%;
an optical output power level P$_{OUT}$ maintained at or above 50 mW and within a range that is less than or equal to a specified upper bound and greater than or equal to a specified lower bound, the specified upper end lower bounds being based on the cavity length L,
the specified lower bound having a value of 50 mW for cavity lengths between approximately 1000 μm and 1380 μm, a value equal to the quantity (1 mW)*[(L−1280 μm)/2 μm)] for cavity lengths of 1380 μm to 1480 μm, a value equal to the quantity (1 mW)*[(L−1260 μm)/2.2 μm)] for cavity lengths of 1480 μm to 1700 μm, a value equal to the quantity (2 mW)*[(L−1600 μm)/1 μm)] for cavity lengths of 1700 μm to 1750 μm, and a value of (3 mW)*[(L−1510 μm)/2 μm)] for cavity lengths of 1750 μm to approximately 1770 μm, and
the specified upper bound having a value equal to the quantity (2 mW)*[(L−950 μm)/1 μm)] for cavity lengths of approximately 1000 μm to 1050 μm, a value equal to the quantity (2 mW)*[(L−750 μm)/3 μm)] for cavity lengths of 1050 μm to 1200 μm, a value equal to the quantity (2 mW)*[(L−450 μm)/5 μm)] for cavity lengths of 1200 μm to 1350 μm, a value equal to the quantity (3 mW)*[(L−150 μm)/10 μm)] for cavity lengths of 1350 μm to 1450 μm, and a value equal to the quantity 390 mW for cavity lengths of 1450 μm to approximately 1770 μm.

17. The semiconductor laser of claim 16 wherein the optical output power level P$_{OUT}$ is between approximately 50 mW and approximately 100 mW, and wherein the cavity length is in the range between approximately 1000 μm and approximately {2 μm*(P$_{OUT}$/1 mW)+1280 μm}.

18. The semiconductor law of claim 16 wherein the optical output power level P$_{OUT}$ is between approximately 100 mW and approximately 200 mW, and wherein the cavity length is in the range between approximately {1 μm*(P$_{OUT}$/2 mW)+950 μm} and approximately {2.2 μm*(P$_{OUT}$/1 mW)+1260 μm}.

19. The semiconductor laser of claim 16 wherein the optical output power level P$_{OUT}$ is between approximately 200 mW and approximately 300 mW, and wherein the cavity length is in the range between approximately {3 μm*(P$_{OUT}$/2 mW)+750 μm} and approximately {1 μm*(P$_{OUT}$/2 mW)+1600 μm}).

20. The semiconductor laser of claim 16 wherein the optical output power level P$_{OUT}$ is between approximately 300 mW and approximately 360 mW, and wherein the cavity length is in the range between approximately {5 μm*(P$_{OUT}$/2 mW)+450 μm} and approximately 1750 μm.

21. The semiconductor laser of claim 16 wherein the optical output power level P$_{OUT}$ is between approximately 360 mW and approximately 390 mW, and wherein the cavity length is in the range between approximately {10 μm*(P$_{OUT}$/3 mW)+150 μm} and approximately {2 μm*(P$_{OUT}$/3 mW)+1510 μm}.

22. The semiconductor laser of claim 16 wherein length L is in the range of approximately 1000 μm to approximately 1100 μm, and wherein the optical output power level P$_{OUT}$ is between approximately 50 mW and approximately 100 mW.

23. The semiconductor laser of claim 16 wherein the length L is in the range of approximately 1200 μm to approximately 1600 μm, and wherein the optical output power level P$_{OUT}$ is between approximately 200 mW and approximately 300 mW.

24. A method of increasing the photoelectric conversion efficiency of a semiconductor laser, the semiconductor laser including a semiconductor laminated structure having a substrate, a lower cladding layer, an upper cladding layer, an active layer disposed between the lower and upper cladding layers, a first electrode, a second electrode, a front facet to output the laser beam, a back facet, and a cavity length L between the front and back facets, the active layer being configured to generate light such that the apparatus provides optical output power at the front facet in response to a source of electrical power applied to the first and second electrodes, the cavity length L being in the range of approximately 1000 μm to approximately 1800 μm, the semiconductor laser further including a low reflectance coating disposed on the front facet having a reflectivity of less than approximately 4%, and a high reflectance coating disposed on the back facet and having a reflectivity of more than approximately 80%, said method comprising the step of:
operating the semiconductor laser at an optical output power level P$_{OUT}$ at or above 50 mW and in a range that is less than or equal to a specified upper bound and which is greater than or equal to a specified lower bound, the specified upper and lower bounds being based on the cavity length L,
the specified lower bound having a value of 50 mW for cavity lengths between approximately 1000 μm and 1380 μm, a value equal to the quantity (1 mW)*[(L−

1280 μm)/2 μm)] for cavity lengths of 1380 μm to 1480 μm, a value equal to the quantity (1 mW)*[(L−1260 μm)/2.2 μm)] for cavity lengths of 1480 μm to 1700 μm, a value equal to the quantity (2 mW)*[(L−1600 μm)/1 μtm)] for cavity lengths of 1700 μm to 1750 μm, and a value of (3 mW)*[(L−1510 μm)/2 μm)] for cavity lengths of 1750 μm to approximately 1770 μm, and the specified upper bound having a value equal to the quantity (2 mW)*[(L−950 μm)/1 μm)] for cavity lengths of approximately 1000 μm to 1050 μm, a value equal to the quantity (2 mW)*[(L−750 μm)/3 μm)] for cavity lengths of 1050 μm to 1200 μm, a value equal to the quantity (2 mW)*[(L−450 μm)/5 μm)] for cavity lengths of 1200 μm to 1350 μm, a value equal to the quantity (3 mW)*[(L−150 μm)/10 μm)] for cavity lengths of 1350 μm to 1450 μm, and a value equal to the quantity 390 mW for cavity lengths of 1450 μm to approximately 1770 μm.

25. The method of claim 24 wherein the laser is operated at an optical output power level $P_{OUT}$ which is between approximately 50 mW and approximately 100 mW, and wherein the cavity length is in the range between approximately 1000 μm and approximately {2 μm*($P_{OUT}$/1 mW)+1280 μm}.

26. The method of claim 24 wherein the laser is operated at an optical output power level $P_{OUT}$ which is between approximately 100 mW and approximately 200 mW, and wherein the cavity length is in the range between approximately {1 μm*($P_{OUT}$/2 mW)+950 μm} and approximately {2.2 μm*($P_{OUT}$/1 mW)+1260 μm}.

27. The method of claim 24 wherein the laser is operated at an optical output power level $P_{OUT}$ which is between approximately 200 mW and approximately 300 mW, and wherein the cavity length is in the range between approximately {3 μm*($P_{OUT}$/2 mW)+750 μm} and approximately {1 μm*($P_{OUT}$/2 mW)+1600 μm}).

28. The method of claim 24 wherein the laser is operated at an optical output power level $P_{OUT}$ which is between approximately 300 mW and approximately 360 mW, and wherein the cavity length is in the range between approximately {5 μm*($P_{OUT}$/2 mW)+450 μm} and approximately 1750 μm.

29. The method of claim 24 wherein the laser is operated at an optical output power level $P_{OUT}$ which is between approximately 360 mW and approximately 390 mW, and wherein the cavity length is in the range between approximately {10 μm*($P_{OUT}$/3 mW)+150 μm} and approximately {2 μm*($P_{OUT}$/3 mW)+1510 μm}.

30. The method of claim 24 wherein the length L is in the range of approximately 1000 μm to approximately 1100 μm, and wherein the optical output power level $P_{OUT}$ is between approximately 50 mW and approximately 100 mW.

31. The method of claim 24 wherein the length L is in the range of approximately 1200 μm to approximately 1600 μm, and wherein the optical output power level $P_{OUT}$ is between approximately 200 mW and approximately 300 mW.

32. A method of forming a semiconductor laser to provide reduced power consumption or increased photoelectric conversion efficiency for a selected output power level $P_{OUT}$ in the range between approximately 50 mW and approximately 40 mW, said method comprising:
  (a) forming a semiconductor laminated structure on a substrate, the step including the steps of forming a lower cladding layer over the substrate, forming an active layer over the lower cladding layer, forming an upper cladding layer over the active layer, and forming a first electrode on the substrate and a second electrode over the upper cladding layer;
  (b) forming the semiconductor laser apparatus from the semiconductor laminated structure such that the apparatus has a front facet, a back facet, and a cavity length between said facets, the active layer being configured to generate light such that the semiconductor laser provides optical output power at the front facet in response to a source of electrical power applied to the first and second electrodes;
  (c) forming a low reflectance coating on the front facet having a reflectivity of less than approximately 4%; and
  (d) forming a high reflectance coating on the back facet having a reflectivity of more than approximately 80%; and
wherein step (b) comprises the step of selecting the cavity length to be at or greater than approximately 1000 μm and within one of five ranges depending upon the value of the selected output power level $P_{OUT}$,
  the first range being between approximately 1000 μm and approximately {2 μm*($P_{OUT}$/1 mW)+1280 μm} for values of $P_{OUT}$ between approximately 50 mW and approximately 100 mW,
  the second range being between approximately {1 μm*($P_{OUT}$/2 mW)+950 μm} and approximately {2.2 μm*($P_{OUT}$/1 mW)+1260 μm} for values of $P_{OUT}$ between approximately 100 mW and approximately 200 mW,
  the third range being between approximately {3 μm*($P_{OUT}$/2 mW)+750 μm} and approximately {1 μm*($P_{OUT}$/2 mW)+1600 μm} for values of $P_{OUT}$ between approximately 200 mW and approximately 300 mW, and
  the fourth range being between approximately {5 μm*($P_{OUT}$/2 mW)+450 μm} and approximately 1750 μm for values of $P_{OUT}$ between approximately 300 mW and approximately 360 mW, and
  the fifth range being between approximately {10 μm*($P_{OUT}$/3 mW)+150 μm} and approximately {2 μm*($P_{OUT}$/3 mW)+1510 μm} for values of $P_{OUT}$ between approximately 360 mW and approximately 390 mW.

33. The method of claim 32 wherein the selected optical output power $P_{OUT}$ is between approximately 50 mW and approximately 100 mW, and wherein the cavity length is in the range between approximately 1000 μm and approximately {2 μm*($P_{OUT}$/1 mW)+1280 μm}.

34. The method of claim 32 wherein the selected optical output power $P_{OUT}$ is between approximately 100 mW and approximately 200 mW, and wherein the cavity length is in the range between approximately{1 μm*($P_{OUT}$/2 mW)+950 μm} and approximately {2.2 μm*($P_{OUT}$/1 mW)+1260 μm}.

35. The method of claim 32 wherein the selected optical output power $P_{OUT}$ is between approximately 200 mW and approximately 300 mW, and wherein the cavity length is in the range between approximately {3 μm*($P_{OUT}$/2 mW)+750 μm} and approximately {1 μm*($P_{OUT}$/2 mW)+1600 μm}.

36. The method of claim 32 wherein the selected optical output power $P_{OUT}$ is between approximately 300 mW and approximately 360 mW, and wherein the cavity length is in the range between approximately {5 μm*($P_{OUT}$/2 mW)+450 μm} and approximately 1750 μm.

37. The method of claim 32 wherein the selected optical output power $P_{OUT}$ is between approximately 360 mW and approximately 390 mW, and wherein the cavity length is in the range between approximately {10 μm*($P_{OUT}$/3 mW)+150 μm} and approximately {2 μm*($P_{OUT}$/3 mW)+1510 μm}).

38. The method of claim 32 wherein the selected optical output power level $P_{OUT}$ is between approximately 50 mW and approximately 100 mW, and wherein the length L is selected in the range of approximately 1000 µm to approximately 1100 µm.

39. The method of claim 32 wherein the selected optical output power level $P_{OUT}$ is between approximately 200 mW and approximately 300 mW, and wherein the length L is in the range of approximately 1200 µm to approximately 1600 µm.

40. The fabrication method of claim 6 wherein said step (a) additionally acquires the relationship of the electric drive power as a function of the cavity length;
   wherein said step (b) determines values of the cavity length and the impurity carrier concentration from the acquired relationship such that the electric driving power is vicinal to a minimum for the desired optical output power; and
   wherein said step (c) forms the semiconductor laser apparatus with values for the cavity length and the impurity carrier concentration that are determined by step (b).

41. The method of claim 1, wherein the active layer is configured to generate light along at least 1000 microns of the length of the cavity.

42. The method of claim 3, wherein the active layer is configured to generate light along at least 1000 microns of the cavity length.

43. The method of claim 6, wherein the active layer is configured to generate light along at least 1000 microns of the length of the cavity.

44. The semiconductor laser of claim 8, wherein the active layer is configured to generate light along at least 1000 microns of the length of the cavity.

45. The semiconductor laser of claim 16, wherein the active layer is configured to generate light along at least 1000 microns of the length of the cavity.

46. The method of claim 24, wherein the active layer is configured to generate light along at least 1000 microns of the length of the cavity.

47. The method of claim 32, wherein the active layer is configured to generate light along at least 1000 microns of the length of the cavity.

* * * * *